United States Patent
Chiu et al.

(10) Patent No.: US 9,058,436 B1
(45) Date of Patent: Jun. 16, 2015

(54) METHOD AND SYSTEM FOR REDUCING THE EFFECT OF COMPONENT AGING

(71) Applicant: ALTERA Corporation, San Jose, CA (US)

(72) Inventors: Gordon Chiu, North York (CA); Navid Azizi, Moses Crescent (CA)

(73) Assignee: ALTERA CORPORATION, San Jose, CA (US)

( * ) Notice: Subject to any disclaimer, the term of this patent is extended or adjusted under 35 U.S.C. 154(b) by 210 days.

(21) Appl. No.: 13/682,730

(22) Filed: Nov. 20, 2012

(51) Int. Cl.
| | |
|---|---|
| *H03M 7/00* | (2006.01) |
| *G06F 11/30* | (2006.01) |
| *G06F 13/38* | (2006.01) |
| *G06F 13/42* | (2006.01) |
| *G06F 13/40* | (2006.01) |

(52) U.S. Cl.
CPC ............ *G06F 13/4009* (2013.01); *G06F 13/42* (2013.01); *G06F 11/3072* (2013.01); *G06F 13/38* (2013.01); *H03M 7/00* (2013.01)

(58) Field of Classification Search
CPC ... G06F 11/30; G06F 11/3003; G06F 1/3027; G06F 11/3065; G06F 11/3072; G06F 13/00; G06F 13/38; G06F 13/42; G06F 13/4009; H03M 7/00
USPC .................. 710/105–106, 305, 300, 320, 323; 365/211; 341/51, 93; 714/1, 47.1, 819, 714/823
See application file for complete search history.

(56) References Cited

U.S. PATENT DOCUMENTS

| | | | |
|---|---|---|---|
| 7,541,829 B1* | 6/2009 | Bolam et al. ............. | 324/750.05 |
| 2005/0134360 A1* | 6/2005 | Aipperspach et al. ........ | 327/513 |
| 2007/0115733 A1* | 5/2007 | Jang et al. ................ | 365/189.07 |
| 2008/0244182 A1* | 10/2008 | Abella et al. .................. | 711/128 |
| 2009/0077286 A1* | 3/2009 | Bertram ........................ | 710/100 |
| 2009/0150656 A1* | 6/2009 | Abella et al. .................. | 712/228 |
| 2009/0179782 A1* | 7/2009 | Hollis .............................. | 341/55 |
| 2010/0046276 A1* | 2/2010 | Chen et al. .................... | 365/154 |

OTHER PUBLICATIONS

Gunadi, Erika, et al. "Combating Aginig with the Colt Duty Cycle Equalizer". 43$^{rd}$ Annual IEEE/ACM International Symposium on Microarchitecture. 2010. IEEE. pp. 103-114.*

Abella, Jaume, et al. "Penelope: The NBTI-Aware Processor". 40$^{th}$ IEEE/ACM International Symposium on Microarchitecture. 2007. IEEE. pp. 85-96.*

(Continued)

*Primary Examiner* — Thomas J Cleary

(57) ABSTRACT

Methods, systems and circuits for reducing aging of at least one component of a data path are disclosed. First data transmitted over a data path may be monitored in an active state to allow generation of second data, where the second data may be transmitted in an inactive state over the data path to improve the balance of any imbalance in the static probability of one logical state versus another caused by transmission of the first data. Portions of data to be transmitted over a data path may be compared to previously-transmitted portions of data to determine a respective data bus inversion (DBI) setting each portion of data, where the DBI settings may be used to increase the toggling of bits of the data path and improve the balance of the static probability of one logical state versus another.

19 Claims, 14 Drawing Sheets

(56) References Cited

OTHER PUBLICATIONS

Wang, Shuai, et al. "Low Power Aging-Aware Register File Design by Duty Cycle Balancing". Design, Automation & Test in Europe Conference & Exhibition (DATE). Mar. 12-16, 2012. pp. 546-549.*

Kumar, Sanjay V., et al. "Impact of NBTI on SRAM Read Stability and Design for Reliability". Proceedings of the $7^{th}$ International Symposium on Quality Electronic Design. 2006. IEEE Computer Society. pp. 210-218.*

* cited by examiner

500

| | Input Data 405 | | | | | | | | DBI 415 | Output Data 425 | | | | | | | |
|---|---|---|---|---|---|---|---|---|---|---|---|---|---|---|---|---|---|
| | D0 | D1 | D2 | D3 | D4 | D5 | D6 | D7 | | D0 | D1 | D2 | D3 | D4 | D5 | D6 | D7 |
| Previous Portion | 1 | 0 | 0 | 1 | 1 | 0 | 0 | 0 | 0 | 1 | 0 | 0 | 1 | 1 | 0 | 0 | 0 |
| Portion 1 | 0 | 0 | 1 | 0 | 1 | 1 | 0 | 1 | 0 | 0 | 0 | 1 | 0 | 1 | 1 | 0 | 1 |
| Portion 2 | 1 | 0 | 0 | 0 | 0 | 1 | 1 | 0 | 0 | 1 | 0 | 0 | 0 | 0 | 1 | 1 | 0 |
| Portion 3 | 1 | 1 | 1 | 0 | 0 | 1 | 0 | 1 | 0 | 1 | 1 | 1 | 0 | 0 | 1 | 0 | 1 |
| Portion 4 | 1 | 0 | 1 | 0 | 0 | 1 | 1 | 1 | 1 | 0 | 1 | 0 | 1 | 1 | 0 | 0 | 0 |

| | Input Data 405 | | | | | | | | DBI 415 | Output Data 425 | | | | | | | |
|---|---|---|---|---|---|---|---|---|---|---|---|---|---|---|---|---|---|
| | D0 | D1 | D2 | D3 | D4 | D5 | D6 | D7 | | D0 | D1 | D2 | D3 | D4 | D5 | D6 | D7 |
| Previous Portion | 1 | 0 | 0 | 1 | 1 | 0 | 0 | 0 | 0 | 1 | 0 | 0 | 1 | 1 | 0 | 0 | 0 |
| Portion 1 | 0 | 1 | 0 | 1 | 0 | 0 | 1 | 0 | <u>1</u> | 1 | 0 | <u>1</u> | <u>0</u> | 1 | <u>1</u> | 0 | <u>1</u> |
| Portion 2 | 0 | 1 | 1 | 1 | 1 | 0 | 0 | 1 | 1 | 1 | 0 | 0 | 0 | <u>0</u> | 1 | <u>1</u> | 0 |
| Portion 3 | 1 | 1 | 1 | 0 | 0 | 1 | 0 | 1 | 0 | 1 | <u>1</u> | 1 | 0 | 0 | 1 | 0 | 1 |
| Portion 4 | 1 | 0 | 1 | 0 | 0 | 1 | 1 | 1 | 1 | <u>0</u> | 1 | 0 | 1 | 1 | 0 | 0 | 0 |

FIGURE 6

METHOD AND SYSTEM FOR REDUCING THE EFFECT OF COMPONENT AGING

BACKGROUND OF THE INVENTION

Transistors in a data path or interface can experience degradation or end-of-life (EOL) effects if stressed or used in certain ways. For example, aging of the transistors can occur if data signals are communicated which result in an imbalance in the static probability of one logical state versus another. Static probability of a particular logical state can be expressed as a ratio of the time spent in the particular logical state to the time spent in all logical states.

Aging of transistors can increase delay or uncertainty associated with transitions between logical states. Since each aged transistor can contribute a respective delay, the total delay experienced by a signal communicated over a data path is typically increased by the number of transistors in the data path. As such, timing uncertainty caused by variation in the total delay can significantly decrease system margin, thereby limiting the speed of data transmission over conventional interfaces using conventional communication circuitry.

Another EOL effect that can increase timing uncertainty is recovery. Recovery refers to the healing or reversal of the aging effect while a transistor is in the "off" state. An aged transistor that is provided a longer recovery time is generally able to more quickly transition from an "off" state to an "on" state than another aged transistor that has been provided a shorter recovery time. Additionally, the delay resulting from the recovery effect may vary from transistor to transistor and may be dependent upon one or more transistor-specific factors such as aging and the like. Accordingly, the delay variation from the recovery effect can further decrease the system margin, thereby further limiting the speed of data transmission over conventional interfaces using conventional communication circuitry.

SUMMARY OF THE INVENTION

Accordingly, a need exists to reduce the aging of components in data paths. A need also exists to reduce the effects of recovery of aged components. A further need exists to reduce the effects of aging and/or recovery to increase the speed of data transmission over interfaces. Embodiments of the present invention provide novel solutions to these needs and others as described below.

Embodiments of the present invention are directed to methods, systems and circuits for reducing aging of at least one component of a data path. In one embodiment, first data transmitted over a data path may be monitored in an active state to allow generation of second data, where the second data may be transmitted in an inactive state over the data path to improve the balance of any imbalance in the static probability of one logical state versus another caused by transmission of the first data. In another embodiment, portions of data to be transmitted over a data path may be compared to previously-transmitted portions of data to determine a respective data bus inversion (DBI) setting each portion of data, where the DBI settings may be used to increase the toggling of bits of the data path (e.g., by transmitting the portions of data in either non-inverted or inverted form) and improve the balance of the static probability of one logical state versus another. Accordingly, aging of components in the data path may be reduced by improving the balance of the static probability of one logical state versus another, thereby allowing a smaller system margin and/or higher data transmission speeds.

In one embodiment, a method of reducing aging of at least one component of a data path includes monitoring a first data signal to determine a quantity associated with a relative number of instances of a first logical state and a second logical state, wherein said first data signal is communicated to a device over said data path, and wherein said first data signal represents a greater number of instances of said first logical state than said second logical state. The method also includes determining that said data path is inactive. The method further includes communicating a second data signal over said data path to reduce aging of at least one component of said data path, wherein said second data signal represents a number of instances of said second logical state that exceeds a number of instances of said first logical state by said quantity.

In another embodiment, a circuit includes a first component comprising a first input and a second input, wherein said first component further comprises an output coupled to a data path, wherein said first component is operable to communicate a first data signal from said first input to said output in a first state, and wherein said first data signal includes a greater number of instances of a first logical state than a second logical state. The circuit also includes a counter and at least one other component operable, in said first state, to monitor said first data signal and control said counter to store a quantity associated with a relative number of instances of said first logical state and said second logical state, and wherein said at least one other component is further operable, in a second state, to generate a second data signal indicative of a number of instances of said second logical state that exceeds a number of instances of said first logical state by said quantity. The first component is further operable, in said second state, to communicate said second data signal from said second input to said output to reduce aging of at least one component of said data path.

In yet another embodiment, a method of reducing aging of at least one component of a data path includes accessing a first portion of data to be transmitted over said data path. A comparison of said first portion of data and a second portion of data is performed, wherein said second portion of data is transmitted over said data path before said first portion of data. The method also includes determining, based on said comparison, a data bus inversion setting associated with transmission of said first portion of data over said data path. The first portion of data is transmitted over said data path to reduce aging of said at least one component of said data path.

BRIEF DESCRIPTION OF THE DRAWINGS

The present invention is illustrated by way of example, and not by way of limitation, in the figures of the accompanying drawings and in which like reference numerals refer to similar elements.

FIG. 5 shows a diagram of a first example of output data in accordance with one embodiment of the present invention.

FIG. 6 shows a diagram of a second example of output data in accordance with one embodiment of the present invention.

DETAILED DESCRIPTION OF THE INVENTION

Figure 1:
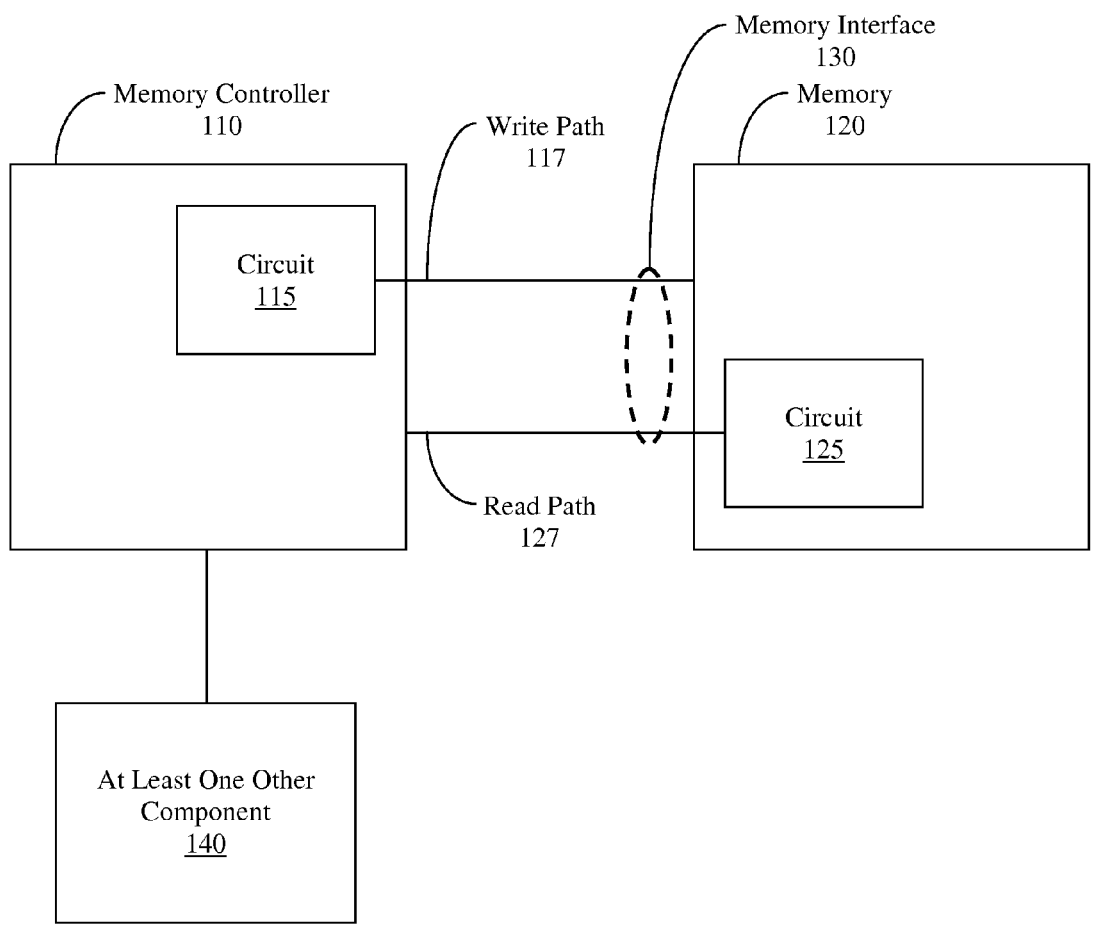
FIG. 1 shows an exemplary system in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accepting," "accessing," "activating," "adding," "analyzing," "applying," "assembling," "assigning," "buffering," "bypassing," "calculating," "capturing," "changing," "collecting," "combining," "communicating," "comparing," "conducting," "configuring," "counting," "creating," "decrementing," "defining," "depicting," "detecting," "determining," "displaying," "establishing," "executing," "facilitating," "filtering," "generating," "grouping," "identifying," "incrementing," "initiating," "interacting," "modifying," "monitoring," "moving," "notifying," "outputting," "performing," "placing," "precharging," "presenting," "processing," "programming," "providing," "querying," "reading," "receiving," "removing," "repeating," "sampling," "scaling," "setting," "sorting," "storing," "subtracting," "tracking," "transforming," "transmitting," "using," "writing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Present Invention

In accordance with one or more embodiments of the present invention, the impact of end-of-life (EOL) effects (e.g., aging, recovery, etc.) on data paths or interfaces can be reduced. For example, aging of components in a data path may be reduced by monitoring the transmission of first data over a data path in an active state to allow generation of second data, where the second data may be transmitted in an inactive state over the data path to improve the balance of any imbalance in the static probability (also known as "cumulative duty cycle" or the like) of one logical state versus another caused by transmission of the first data (e.g., in accordance with FIGS. 1, 2 and 3). Accordingly, aging of components in the data path may be reduced by improving the balance of the static probability of one logical state versus another, thereby allowing a smaller system margin and/or higher data transmission speeds.

As another example of aging reduction, portions of data to be transmitted over a data path may be compared to previously-accessed portions of data to determine a respective data bus inversion (DBI) setting for each portion of data, where the DBI settings may be used to increase the toggling of bits of the data path (e.g., by transmitting the portions of data in either non-inverted or inverted form) and improve the balance of the static probability of one logical state versus another (e.g., in accordance with FIGS. 1, 4, 5, 6, 7A and 7B). Accordingly, aging of components in the data path may be reduced by improving the balance of the static probability of one logical state versus another, thereby allowing a smaller system margin and/or higher data transmission speeds.

As an example of recovery reduction (e.g., as described with respect to FIGS. 8, 9, 10A and 10B), data which toggles at least one bit may be periodically communicated (e.g., during or as part of refresh intervals of a memory interface) over a data path, where toggling of at least one bit may effectively reset the recovery period for any transistors in the data path associated with the at least one bit. Timing uncertainty associated with a data path may be reduced by limiting the amount of recovery experienced by one or more transistors of the data path. Accordingly, recovery of transistors in a data path may be limited to predetermined amount by toggling bits of the data path at a predetermined frequency (e.g., associated with the frequency of the data communication over the data path), thereby reducing timing uncertainty and allowing a smaller system margin and/or higher data transmission speeds.

Aging Reduction by Data Transmission in an Inactive State

FIG. 1 shows exemplary system 100 in accordance with one embodiment of the present invention. As shown in FIG. 1, memory controller 110 and memory 120 are coupled by memory interface 130, where memory interface 130 includes write path 117 and read path 127. Write path 117 and/or read path 127 may be data paths used to communicate data signals in one embodiment.

Circuit 115 of memory controller 110 may be coupled to write path 117. A first data signal received by circuit 115 (e.g., from another component of memory controller 110, from at least one other component 140, etc.) may be communicated, in an active state, over write path 117 to allow first data (e.g., associated with the first data signal) to be written in memory 120. The first data signal may be associated with (e.g., include, be indicative of, represent, etc.) a greater number of instances of a first logical state (e.g., low, a "0," high, a "1," etc.) than a second logical state (e.g., low, a "0," high, a "1," etc.), thereby causing an imbalance in the static probability of one logical state versus another. Circuit 115 may monitor the first data signal (e.g., to track the imbalance in static probability) and generate a second data signal that is associated with (e.g., include, be indicative of, represent, etc.) a greater number of instances of the second logical state than the first logical state. The second data signal may be transmitted over write path 117 to correct or improve the imbalance in static probability (e.g., caused by transmission of the first data signal), thereby reducing aging of components (e.g., transistors, other components, etc.) in write path 117 and/or providing one or more other advantages (e.g., increasing system margin, allowing higher data transmission speeds over write path 117, allowing higher operating frequencies, etc.). In one embodiment, second data (e.g., associated with the second data signal) may not be written into memory 120.

The second data may be transmitted over write path 117 in an inactive state in one embodiment. In one embodiment, an inactive state may be any state where write path 117 is not being used to transmit data that is written into memory 120. And in one embodiment, an inactive state may be one in which reads are performed (e.g., over read path 127), controller bank management (e.g., involving commands such as "activate" and "precharge" which open and close, respectively, specific rows within a bank or portion of memory) is performed, refresh cycles are performed, some combination thereof, etc.

Circuit 125 of memory 120 may be coupled to read path 127. A first data signal received by circuit 125 (e.g., from at least one memory device or bank of memory 120, from another component of memory 120, etc.) may be communicated, in an active state, over read path 127 to allow first data (e.g., associated with the first data signal) to be read from memory 120. The first data signal may be associated with (e.g., include, be indicative of, represent, etc.) a greater number of instances of a first logical state (e.g., low, a "0," high, a "1," etc.) than a second logical state (e.g., low, a "0," high, a "1," etc.), thereby causing an imbalance in the static probability of one logical state versus another. Circuit 125 may monitor the first data signal (e.g., to track the imbalance in static probability) and generate a second data signal that is associated with (e.g., include, be indicative of, represent, etc.) a greater number of instances of the second logical state than the first logical state. The second data signal may be transmitted over read path 127 to correct or improve the imbalance in static probability (e.g., caused by transmission of the first data signal), thereby reducing aging of components (e.g., transistors, other components, etc.) in read path 127 and/or providing one or more other advantages (e.g., reducing system margin, allowing higher data transmission speeds over read path 127, allowing higher operating frequencies, etc.). In one embodiment, second data (e.g., associated with the second data signal) may not be accessed by another component (e.g., of memory controller 110, of at least one other component 140, etc.).

The second data may be transmitted over read path 127 in an inactive state in one embodiment. In one embodiment, an inactive state may be any state where read path 127 is not being used to transmit data that is read from memory 120. And in one embodiment, an inactive state may be one in which writes are performed (e.g., over write path 117), controller bank management (e.g., involving commands such as "activate" and "precharge" which open and close, respectively, specific rows within a bank or portion of memory) is performed, refresh cycles are performed, some combination thereof, etc.

In one embodiment, circuit 115 may monitor a first data signal (e.g., associated with first data read from memory 120) transmitted over read path 127. Circuit 115 may monitor the first data signal (e.g., to track the imbalance in static probability) and generate a second data signal that is associated with (e.g., include, be indicative of, represent, etc.) a greater number of instances of the second logical state than the first logical state. The second data signal may be transmitted over write path 117 and looped back over read path 127 to correct or improve the imbalance in static probability (e.g., caused by transmission of the first data signal) associated with read path 127, thereby reducing aging of components (e.g., transistors, other components, etc.) in read path 127 and/or providing one or more other advantages (e.g., reducing system margin, allowing higher data transmission speeds over read path 127, allowing higher operating frequencies, etc.). In one embodiment, second data (e.g., associated with the second data signal that is transmitted over write path 117 and looped back over read path 127) may not be written into memory 120.

At least one other component 140 may be any system, device, or other component coupled to memory controller 110. For example, at least one other component 140 may be or include one or more components of a programmable logic device (e.g., 1100 of FIG. 11), one or more components of a computer system (e.g., 1200 of FIG. 12), etc.

Figure 11:
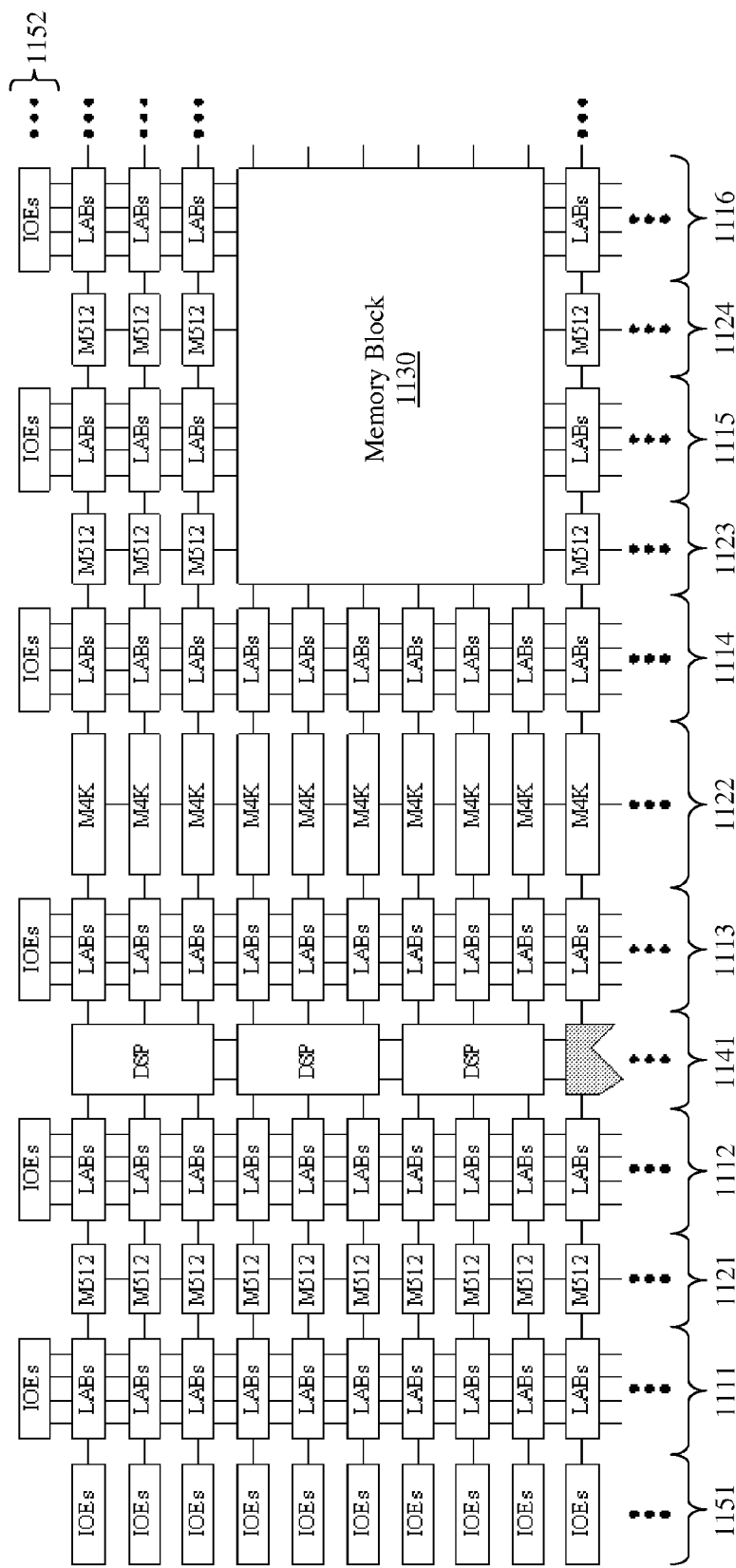
FIG. 11 shows an exemplary programmable logic device that can be used to implement one or more components of one or more embodiments of the present invention.

In one embodiment, one or more components of system 100 may be implemented by a programmable logic device (PLD) such as PLD 1100 of FIG. 11. For example, memory controller 110 may be implemented using a PLD. As another example, memory 120 may be implemented using a PLD. And as yet another example, circuit 115 and/or circuit 125 may be implemented using a PLD.

Figure 2:
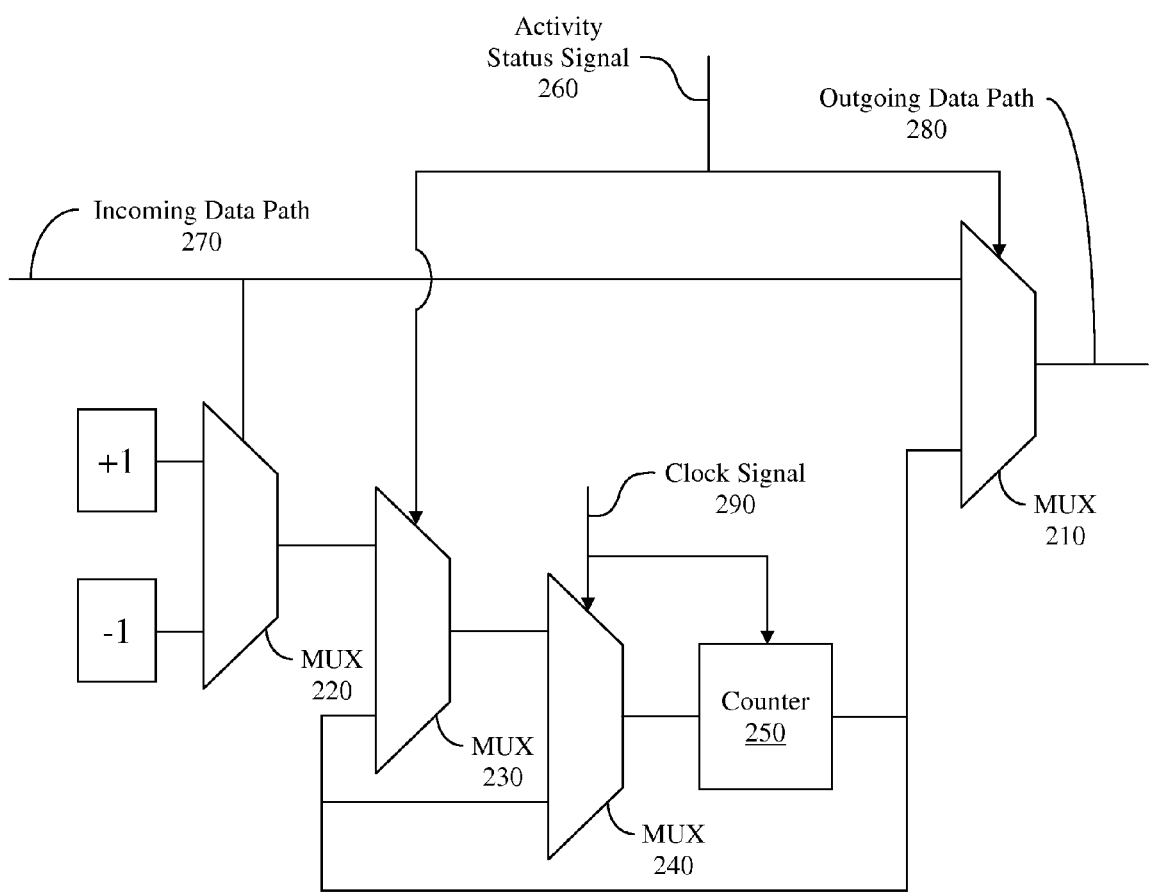
FIG. 2 shows an exemplary circuit in accordance with one embodiment of the present invention.

FIG. 2 shows exemplary circuit 200 in accordance with one embodiment of the present invention. In one embodiment, circuit 200 may be used to implement circuit 115. In this case, incoming data path 270 may be coupled to a component of memory controller 110, to at least one other component 140, etc., whereas outgoing data path 280 may be coupled to write path 117. In one embodiment, circuit 200 may be used to implement circuit 125. In this case, incoming data path 270 may be coupled to at least one memory device or bank of memory 120, another component of memory 120, etc., whereas outgoing data path 280 may be coupled to read path 127.

As shown in FIG. 2, circuit 200 may operate in a plurality of different states or modes. In a first state (e.g., an active state selected using activity status signal 260), a first data signal may be communicated using multiplexer (MUX) 210 from incoming data path 270 (e.g., coupled to a first input of MUX 210) to outgoing data path 280 (e.g., coupled to the output of MUX 210). At least one other component of circuit 200 (e.g., MUX 220, MUX 230, MUX 240, counter 250, etc.) may be used to monitor the first data signal and track an imbalance in the static probability of one logical state versus another with respect to the first data signal. For example, the first data signal may be associated with (e.g., include, be indicative of, represent, etc.) a greater number of instances of a first logical state (e.g., low, a "0," high, a "1," etc.) than a second logical state (e.g., low, a "0," high, a "1," etc.). Counter 250 may be used to store a value associated with the imbalance in the static probability (e.g., a quantity associated with a relative number of instances of the first logical state and the second logical state).

In a second state (e.g., an inactive state selected using activity status signal 260), the at least one other component of circuit 200 (e.g., MUX 220, MUX 230, MUX 240, counter 250, etc.) may be used to generate a second data signal that is associated with (e.g., include, be indicative of, represent, etc.) a greater number of instances of the second logical state than the first logical state. The second data signal may be communicated using MUX 210 (e.g., a second input coupled to counter 250) to outgoing data path 280 (e.g., coupled to the output of MUX 210). As such, where outgoing data path 280 is coupled to a data path of an interface (e.g., write path 117, read path 127, etc.), the second data signal may be communicated over the data path to correct or improve the imbalance in static probability (e.g., caused by transmission of the first data signal), thereby reducing aging of components (e.g., transistors, other components, etc.) in the data path and/or providing one or more other advantages (e.g., reducing system margin, allowing higher data transmission speeds over the data path, allowing higher operating frequencies, etc.).

In one embodiment, counter 250 may be incremented or decremented by MUX 240 (e.g., in an active state selected using activity status signal 260). For example, logical states in the first data signal may cause MUX 220 to select either a "+1" (e.g., to cause an incrementing of counter 250) or a "−1" (e.g., to cause a decrementing of counter 250), where the selected value may be communicated by MUX 230 and MUX 240 and used to adjust the counter (e.g., responsive to clocking in the selected value based on clock signal 290 accessed by MUX 240 and counter 250). In one embodiment, clock signal 290 may have the same or similar clock frequency as a clock signal corresponding to the first data signal accessed via incoming data path 270. In this manner, circuit 200 may be used to track and store a value associated with the imbalance in the static probability of one logical state versus another logical state of the first data signal (e.g., a quantity associated with a relative number of instances of the first logical state and the second logical state).

In one embodiment, the second data signal may be generated (e.g., in an inactive state selected using activity status signal 260) by clocking out values from counter 250. For example, if counter 250 stores a value of "+3" (e.g., indicating that the first data signal is associated with (e.g., include, be indicative of, represent, etc.) 3 more instances of a first logical state than a second logical state), then a second data signal may be generated by clocking out values from counter 250 such that the second data signal is associated with (e.g., include, be indicative of, represent, etc.) 3 more instances of the second logical state than the first logical state. As such, the second data signal may be communicated over a data path (e.g., coupled to outgoing data path 280 such as write path 117, read path 127, etc.) to correct or improve the imbalance in static probability (e.g., caused by transmission of the first data signal), thereby reducing aging of components (e.g., transistors, other components, etc.) in the data path and/or providing one or more other advantages (e.g., reducing system margin, allowing higher data transmission speeds over the data path, allowing higher operating frequencies, etc.).

Although FIG. 1 shows a specific number of components, it should be appreciated that system 100 may include any number of components in other embodiments. Additionally, although FIG. 1 shows a specific arrangement of components, it should be appreciated that system 100 may include any arrangement of components in other embodiments.

Although FIG. 2 shows a specific number of components, it should be appreciated that circuit 200 may include any number of components in other embodiments. Additionally, although FIG. 2 shows a specific arrangement of components, it should be appreciated that circuit 200 may include any arrangement of components in other embodiments.

Figure 3:
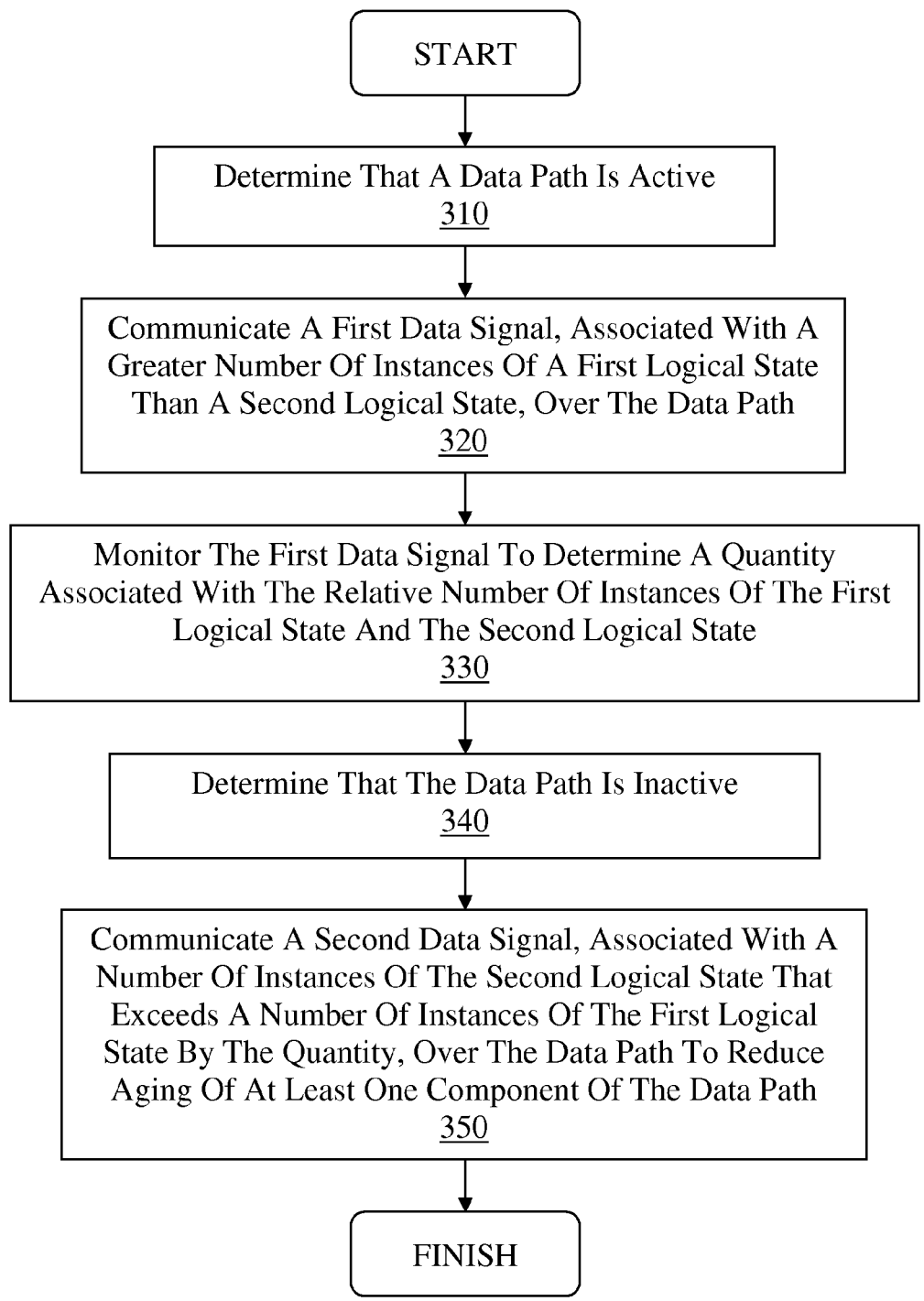
FIG. 3 shows a flowchart of an exemplary process for reducing aging of at least one component of a data path in accordance with one embodiment of the present invention.

FIG. 3 shows a flowchart of exemplary process 300 for reducing aging of at least one component of a data path in accordance with one embodiment of the present invention. As shown in FIG. 3, step 310 involves determining that a data path (e.g., write path 117, read path 127, incoming data path 270, outgoing data path 280, etc.) is active. Step 310 may involve determining that a data path is active based on a state of a signal (e.g., activity status signal 260) in one embodiment. And in one embodiment, the data path may be determined to be active in step 310 if the data path is being used to transfer data.

Step 320 involves communicating a first data signal over the data path. The first data signal may be associated with (e.g., include, be indicative of, represent, etc.) a greater number of instances of a first logical state than a second logical state.

The first data signal may be communicated in step 320 using a circuit (e.g., 200) including at least one multiplexer (e.g., 210, 220, 230, 240, etc.) in one embodiment. For example, the first data signal may be communicated using a MUX (e.g., 210) from an incoming data path (e.g., 270 coupled to a first input of MUX 210) to an outgoing data path (e.g., 280 coupled to the output of MUX 210).

In one embodiment, step 320 may involve communicating the first data signal from a memory controller (e.g., 110) to a memory (e.g., 120) using a circuit (e.g., 115) of the memory controller. In this case, the first data signal may be accessed from a component of the memory controller (e.g., 110), from at least one other component (e.g., 140), etc.

Step 320 may involve communicating the first data signal from a memory (e.g., 120) to a memory controller (e.g., 110) using a circuit (e.g., 125) of the memory in one embodiment. In this case, the first data signal may be accessed from at least one memory device or bank of the memory (e.g., 120), from another component of the memory (e.g., 120), etc.

As shown in FIG. 3, step 330 involves monitoring the first data signal to determine a quantity associated with the relative number of instances of the first logical state and the second logical state. A counter (e.g., 250) may be used in step 330 to determine the quantity. In one embodiment, the monitoring may be performed in step 330 using a circuit (e.g., 115) of a memory controller (e.g., 110). And in one embodiment, the monitoring may be performed in step 330 using a circuit (e.g., 125) of a memory (e.g., 120).

Step 340 involves determining that the data path (e.g., write path 117, read path 127, incoming data path 270, outgoing data path 280, etc.) is inactive. Step 340 may involve determining that a data path is inactive based on a state of a signal (e.g., activity status signal 260) in one embodiment. In one embodiment, the data path may be determined to be inactive in step 340 if the data path is not being used to transfer data.

Where the data path is a write path (e.g., 117), the data path may be determined to be inactive in step 340 if reads are being performed (e.g., over read path 127), controller bank management (e.g., involving commands such as "activate" and "precharge" which open and close, respectively, specific rows within a bank or portion of memory) is being performed, refresh cycles are being performed, some combination thereof, etc. Alternatively, where the data path is a read path (e.g., 127), the data path may be determined to be inactive in step 340 if writes are being performed (e.g., over write path 117), controller bank management (e.g., involving commands such as "activate" and "precharge" which open and close, respectively, specific rows within a bank or portion of memory) is being performed, refresh cycles are being performed, some combination thereof, etc.

As shown in FIG. 3, step 350 involves communicating a second data signal over the data path to reduce aging of at least one component (e.g., at least one transistor, at least one other component, etc.) of the data path. The second data signal may be associated with (e.g., include, be indicative of, represent, etc.) a number of instances of the second logical state that exceeds a number of instances of the first logical state by the quantity (e.g., determined in step 330). Accordingly, communication of the second data signal over the data path in step 350 may correct or improve the imbalance in static probability (e.g., caused by transmission of the first data signal in step 320), thereby reducing aging of components (e.g., transistors, other components, etc.) in the data path and/or providing one or more other advantages (e.g., reducing system margin, allowing higher data transmission speeds over the data path, allowing higher operating frequencies, etc.).

A counter (e.g., 250) may be used in step 350 to generate the second data signal. In one embodiment, the second data signal may be generated in step 350 using a circuit (e.g., 115) of a memory controller (e.g., 110). And in one embodiment, the second data signal may be generated in step 350 using a circuit (e.g., 125) of a memory (e.g., 120).

Aging Reduction Using Data Bus Inversion to Transmit Data in an Active State

Figure 4:
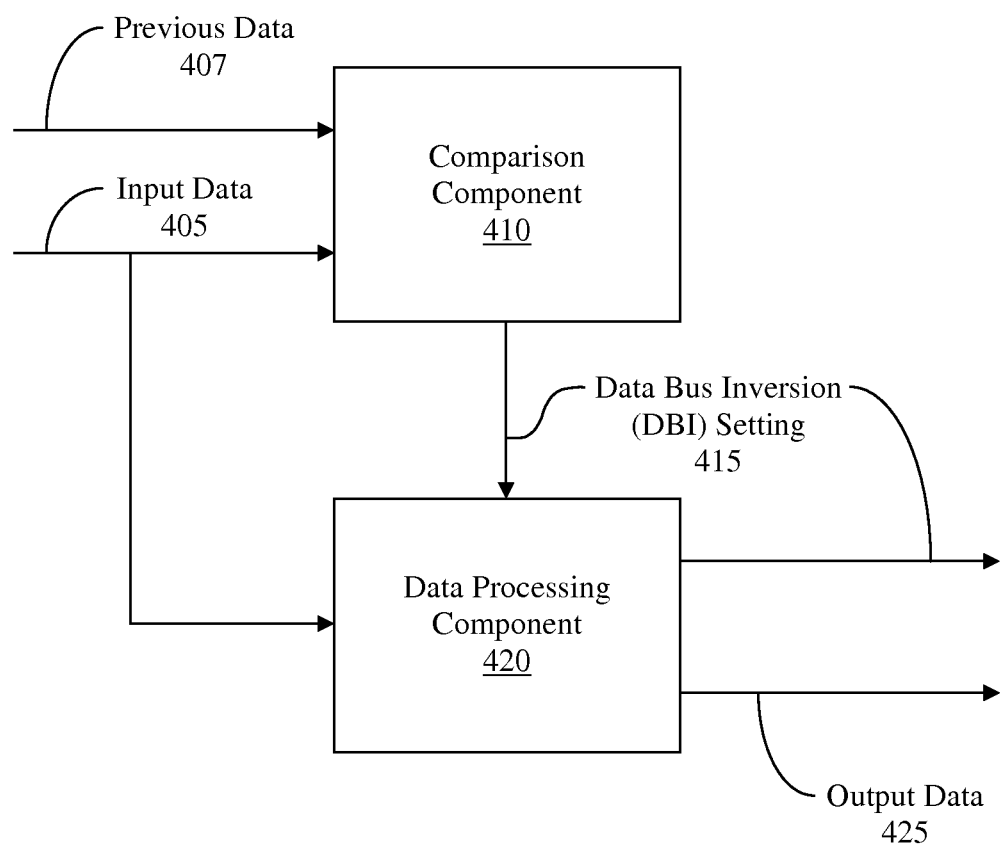
FIG. 4 shows an exemplary circuit for performing selective data bus inversion in accordance with one embodiment of the present invention.

FIG. 4 shows exemplary circuit 400 for performing selective data bus inversion in accordance with one embodiment of the present invention. In one embodiment, circuit 400 may be used to implement circuit 115. In this case, input data 405 may be accessed from memory controller 110, to at least one other component 140, etc., whereas output data 425 may be communicated to write path 117. In one embodiment, circuit 400 may be used to implement circuit 125. In this case, input data 405 may be accessed from at least one memory device or bank of memory 120, another component of memory 120, etc., whereas output data 425 may be communicated to read path 127.

As shown in FIG. 4, comparison component 410 may compare portions of data to be transmitted over a data path (e.g., input data 405) to previously-accessed portions of data (e.g., previous data 407) to determine a respective data bus inversion (DBI) setting (e.g., 415) for each portion of data. The at least one DBI setting (e.g., 415) may be accessed by data processing component 420 to determine whether or not to invert the portions of data to be transmitted over a data path (e.g., input data 405), where the data (e.g., an inverted version of input data 405, input data 405 in an unprocessed or non-inverted form, etc.) may be output (e.g., as output data 425) with the at least one DBI setting (e.g., 415) to be communicated over the data path (e.g., write path 117, read path 127, etc.). The output data (e.g., 425) and the at least one DBI setting (e.g., 415) may be transmitted over the data path contemporaneously (e.g., in parallel, as part of the same data packet, etc.) or sequentially (e.g., serially).

Accordingly, selective inversion of the data bus may be used to increase the toggling of bits of the data path (e.g., by transmitting portions of data in either non-inverted or inverted form) and therefore improve the balance of the static probability of one logical state versus another. Thus, aging of components in the data path may be reduced by improving the balance of the static probability of one logical state versus another, thereby allowing a smaller system margin and/or higher data transmission speeds.

As shown in FIG. 4, previous data 407 may be at least one portion of data that was previously accessed (e.g., as input data 405) and/or previously output (e.g., as output data 425). Previous data 407 may be buffered using a memory of circuit 400 and/or a memory of another component (e.g., of circuit 115, circuit 125, a memory controller such as memory controller 110, a memory such as memory 120, etc.). As such, in one embodiment, each portion of input data 405 may be buffered (e.g., after access by comparison component 410) to allow subsequent comparison to the next portion of input data 405.

FIG. 5 shows diagram 500 of a first example of output data 425 in accordance with one embodiment of the present invention. As shown in FIG. 5, diagram 500 includes a respective portion of output data (e.g., 425) and a respective DBI setting (e.g., 415) for each portion of input data (e.g., 405). Each portion of data (e.g., a portion of input data 405 within a given row, a portion of output data 425 within a given row, etc.) may correspond to a respective word of data or other quantity of data. A DBI setting of "0" may cause output data 425 to be a non-inverted version of (e.g., the same as) input data 405, whereas a DBI setting of "1" may cause output data 425 to be an inverted version of input data 405. For example, the first four rows of diagram 500 include output data 425 that is a non-inverted version of input data 405 (e.g., corresponding to a DBI setting of "0"), whereas the last row of diagram 500 includes output data 425 that is an inverted version of input data 405 (e.g., corresponding to a DBI setting of "1"). As such, a DBI setting may be used to selectively invert a data bus to cause bits to toggle (indicated by underlining in diagram 500) with respect to previously-accessed data.

In one embodiment, a DBI setting for a portion of data may be selected by comparing a portion of input data to a previous portion of output data to determine a DBI setting that causes the largest number of bits to toggle. If each DBI setting for a subsequent portion of data causes the same number of bits to toggle, either DBI setting may be selected in one embodiment.

For example, a DBI setting of "0" may be selected for the first portion of output data 425 (e.g., in the second row of diagram 500) by comparing the first portion of input data 405 (e.g., in the second row of diagram 500) to the previous portion of output data 425 (e.g., in the first row of diagram 500) to determine that a DBI setting of "0" causes 5 bits to toggle versus a DBI setting of "1" that causes only 3 bits to toggle. As another example, a DBI setting of "0" may be selected for the second portion of output data 425 (e.g., in the third row of diagram 500) by comparing the second portion of input data 405 (e.g., in the third row of diagram 500) to the previous portion of output data 425 (e.g., in the second row of diagram 500) to determine that a DBI setting of "0" causes 2 additional bits to toggle versus a DBI setting of "1" that causes only 1 additional bit to toggle. As a further example, a DBI setting of "0" may be selected for the third portion of output data 425 (e.g., in the fourth row of diagram 500) by comparing the third portion of input data 405 (e.g., in the fourth row of diagram 500) to the previous portion of output data 425 (e.g., in the third row of diagram 500) to determine that a DBI setting of "0" causes 1 additional bit to toggle versus a DBI setting of "1" that causes no additional bits to toggle. As yet another example, a DBI setting of "1" may be selected for the fourth portion of output data 425 (e.g., in the fifth row of diagram 500) since all bits of output data 425 have been toggled and since the DBI setting bit has not yet been toggled.

FIG. 6 shows diagram 600 of a second example of output data 425 in accordance with one embodiment of the present invention. As shown in FIG. 6, diagram 600 includes a respective portion of output data (e.g., 425) and a respective DBI setting (e.g., 415) for each portion of input data (e.g., 405). Each portion of data (e.g., a portion of input data 405 within a given row, a portion of output data 425 within a given row, etc.) may correspond to a respective word of data or other quantity of data. A DBI setting of "0" may cause output data 425 to be a non-inverted version of (e.g., the same as) input data 405, whereas a DBI setting of "1" may cause output data 425 to be an inverted version of input data 405. For example, the first and fourth rows of diagram 600 include output data 425 that is a non-inverted version of input data 405 (e.g., corresponding to a DBI setting of "0"), whereas the other rows (e.g., the second, third and fifth rows) of diagram 600 includes output data 425 that is an inverted version of input data 405 (e.g., corresponding to a DBI setting of "1"). As such, a DBI setting may be used to selectively invert a data bus to cause bits to toggle (indicated by underlining in diagram 600) with respect to previously-accessed data.

In one embodiment, where each DBI setting for a particular portion of data cause the same number of bits to toggle, the DBI setting that causes the DBI setting bit to toggle may be selected. DBI settings for subsequent portions of data may be selected by comparing a portion of input data to a previous portion of output data to determine a DBI setting that causes the largest number of bits to toggle in one embodiment. If each DBI setting for a subsequent portion of data causes the same number of bits to toggle, either DBI setting may be selected in one embodiment.

For example, a DBI setting of "1" may be selected for the first portion of output data 425 (e.g., in the second row of diagram 600) since each DBI setting (e.g., "0" and "1") causes 4 bits to toggle and since a DBI setting of "1" causes the DBI setting bit to toggle (e.g., compared to the previous DBI setting of "0" corresponding to the previous portion of data in the first row of diagram 600). As another example, a DBI setting of "1" (or "0") may be selected for the second portion of output data 425 (e.g., in the third row of diagram 600) by comparing the second portion of input data 405 (e.g., in the third row of diagram 600) to the previous portion of output data 425 (e.g., in the second row of diagram 600) to determine that each DBI setting (e.g., "0" and "1") causes 2 additional bits to toggle. As a further example, a DBI setting of "0" (or "1") may be selected for the third portion of output data 425 (e.g., in the fourth row of diagram 600) by comparing the third portion of input data 405 (e.g., in the fourth row of diagram 600) to the previous portion of output data 425 (e.g., in the third row of diagram 600) to determine that each DBI setting (e.g., "0" and "1") causes 1 additional bit to toggle. As yet another example, a DBI setting of "1" may be selected for the fourth portion of output data 425 (e.g., in the fifth row of diagram 600) by comparing the fourth portion of input data 405 (e.g., in the fifth row of diagram 500) to the previous portion of output data 425 (e.g., in the fourth row of diagram 500) to determine that a DBI setting of "1" causes 1 additional bit to toggle versus a DBI setting of "0" that causes no additional bits to toggle.

Although FIG. 4 shows a specific number of components, it should be appreciated that circuit 400 may include any number of components in other embodiments. Additionally, although FIG. 4 shows a specific arrangement of components, it should be appreciated that circuit 400 may include any arrangement of components in other embodiments.

Although FIG. 5 shows diagram 500 with a specific amount and type of data, it should be appreciated that diagram 500 may include any amount and/or type of data in other embodiments. For example, diagram 500 may include any number of portions of data in other embodiments. As another example, each portion of data within diagram 500 may include any number of bits of data in other embodiments.

Although FIG. 6 shows diagram 600 with a specific amount and type of data, it should be appreciated that diagram 600 may include any amount and/or type of data in other embodiments. For example, diagram 600 may include any number of portions of data in other embodiments. As another example, each portion of data within diagram 600 may include any number of bits of data in other embodiments.

Figure 7A:
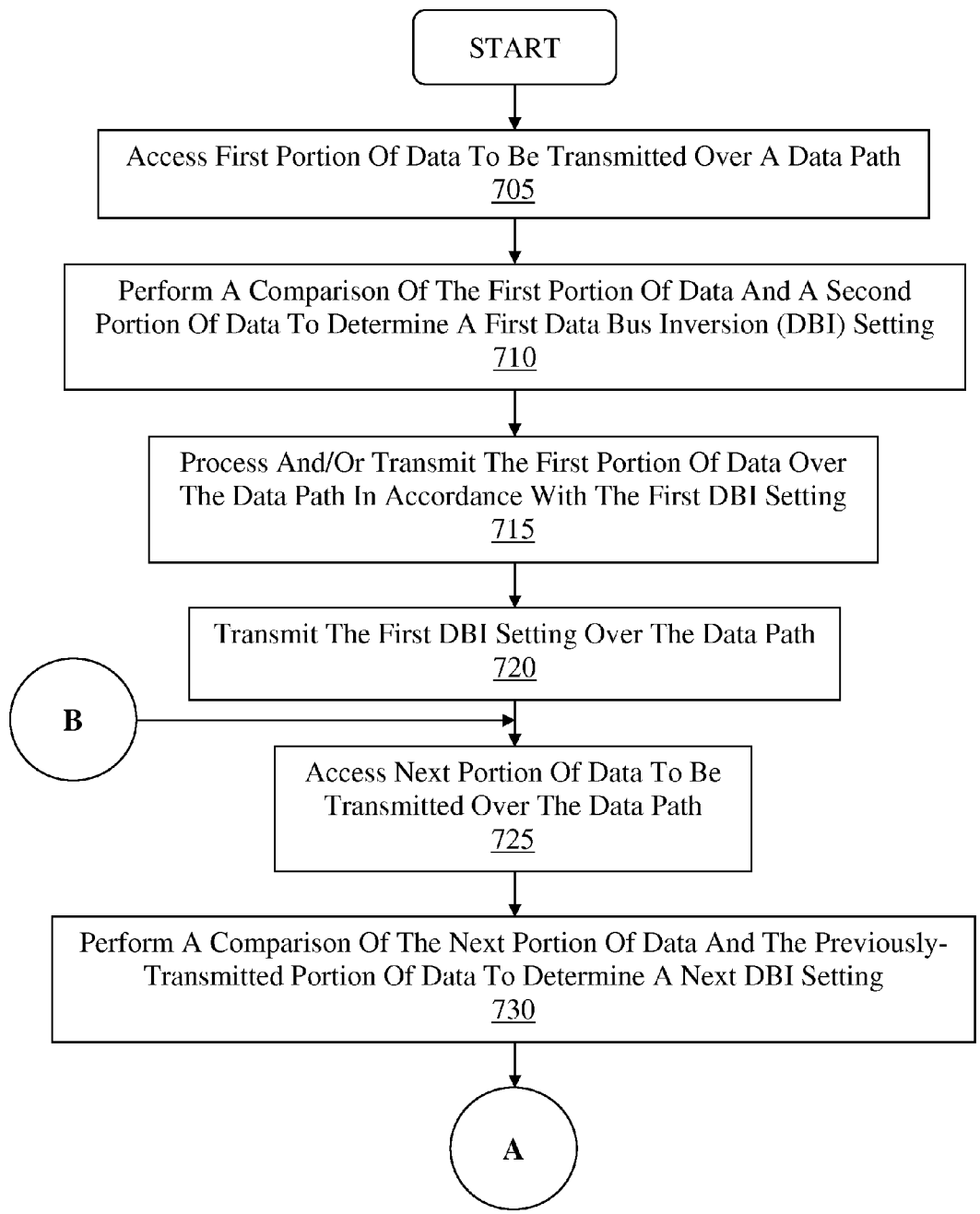
FIG. 7A shows a first portion of a flowchart of an exemplary process for reducing aging of at least one component of a data path in accordance with one embodiment of the present invention.
Figure 7B:
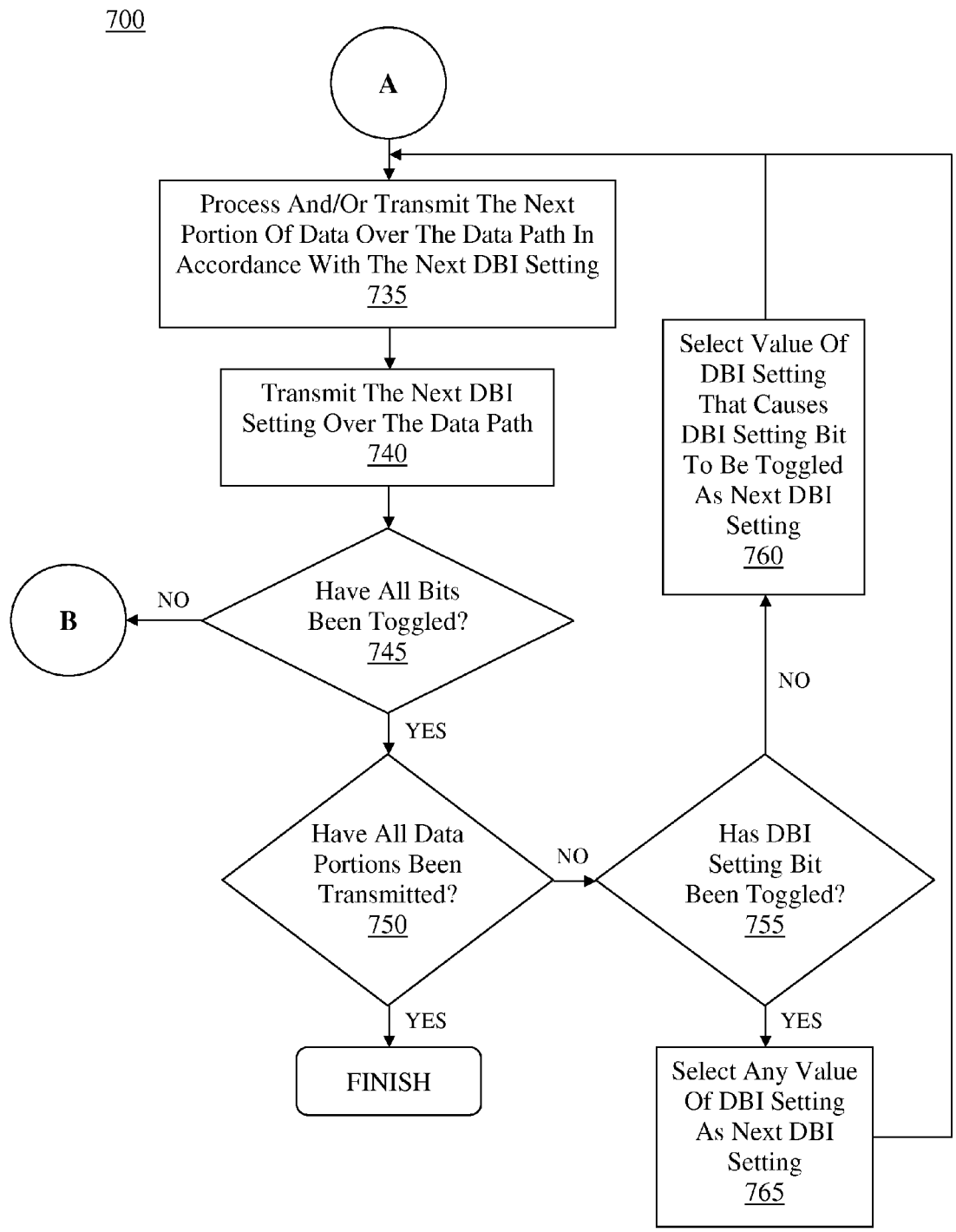
FIG. 7B shows a second portion of a flowchart of an exemplary process for reducing aging of at least one component of a data path in accordance with one embodiment of the present invention.

FIGS. 7A and 7B show a flowchart of exemplary process 700 for reducing aging of at least one component of a data path in accordance with one embodiment of the present invention. As shown in FIG. 7A, step 705 involves accessing a first portion of data (e.g., the portion of data associated with the second row of input data 405 of either diagram 500 or diagram 600) to be transmitted over a data path (e.g., write path 117, read path 127, etc.). The first portion of data may be a word of data, another quantity of data, etc.

Step 710 involves performing a comparison of the first portion of data and a second portion of data (e.g., the portion of data associated with the first row of output data 425 of either diagram 500 or diagram 600) to determine a first data bus inversion (DBI) setting (e.g., in the first row of either diagram 500 or diagram 600). Step 710 may be performed by a comparison component (e.g., 410) in one embodiment.

In one embodiment, where each value of the first DBI setting causes a different number of bits to be toggled (e.g., a DBI setting of "0" causes 5 bits to be toggled in the second row of output data 425 of diagram 500, whereas a DBI setting of "1" causes only 3 bits to be toggled), step 710 may involve selecting the value of the first DBI setting that causes the largest number of bits to be toggled (e.g., a DBI setting of "0" which causes 5 bits to be toggled) as the first DBI setting. Alternatively, where each value of the first DBI setting causes the same number of bits to be toggled (e.g., the DBI settings of "0" and "1" each cause 4 bits to be toggled in the second row of output data 425 of diagram 600), step 710 may involve selecting the value of the first DBI setting that causes the DBI setting bit to toggle (e.g., a DBI setting of "1" for the second row of diagram 600 since the previous DBI setting was "0" in the first row of diagram 600) as the first DBI setting.

As shown in FIG. 7A, step 715 involves processing and/or transmitting the first portion of data over the data path in accordance with the first DBI setting. Step 715 may be performed by a data processing component (e.g., 420) in one embodiment.

In one embodiment, step 715 may involve inverting the first portion of data before transmission. For example, where the first DBI setting is associated with a data bus inversion, the first portion of data may be inverted in step 715 responsive to accessing or detecting the first DBI setting. Thereafter, the first portion of data may be transmitted over the data path in inverted form to cause one or more bits to toggle.

Alternatively, the first portion of data may be communicated over the data path in step 715 without inversion in one embodiment. For example, where the first DBI setting is associated with a non-inversion of a data bus, the first portion of data may not be inverted (e.g., passed through) in step 715 responsive to accessing or detecting the first DBI setting. Thereafter, the first portion of data may be transmitted over the data path in non-inverted form to cause one or more bits to toggle.

As shown in FIG. 7A, step 720 involves transmitting the first DBI setting over the data path. In one embodiment, the first DBI setting may be transmitted in step 720 contemporaneously (e.g., in parallel, as part of the same data packet, etc.) with the first portion of data transmitted in step 715. Alternatively, the first portion of data and the first DBI setting may be transmitted sequentially (e.g., serially) in one embodiment.

Step 725 involves accessing a next portion of data (e.g., the portion of data associated with the third row of input data 405 of either diagram 500 or diagram 600) to be transmitted over the data path. The next portion of data may be a word of data, another quantity of data, etc.

As shown in FIG. 7A, step 730 involves performing a comparison of the next portion of data and a previously-transmitted portion of data (e.g., transmitted in step 715, etc.) to determine a next data bus inversion (DBI) setting (e.g., in the second row of either diagram 500 or diagram 600). Step 730 may be performed by a comparison component (e.g., 410) in one embodiment.

In one embodiment, where each value of the next DBI setting causes a different number of additional bits to be toggled (e.g., a DBI setting of "0" causes 2 additional bits to be toggled in the third row of output data 425 of diagram 500, whereas a DBI setting of "1" causes only 1 additional bit to be toggled), step 730 may involve selecting the value of the next DBI setting that causes the largest number of bits to be toggled (e.g., a DBI setting of "0" which causes 2 bits to be toggled) as the first DBI setting. Alternatively, where each value of the next DBI setting causes the same number of bits to be toggled (e.g., the DBI settings of "0" and "1" each cause 4 bits to be toggled in the second row of output data 425 of diagram 600), step 730 may involve selecting either value of the DBI setting.

As shown in FIG. 7B, step 735 involves processing and/or transmitting the next portion of data over the data path in accordance with the next DBI setting. Step 735 may be performed by a data processing component (e.g., 420) in one embodiment.

In one embodiment, step 735 may involve inverting the next portion of data before transmission. For example, where the next DBI setting is associated with a data bus inversion, the next portion of data may be inverted in step 735 responsive to accessing or detecting the next DBI setting. Thereafter, the next portion of data may be transmitted over the data path in inverted form.

Alternatively, the next portion of data may be communicated over the data path in step 735 without inversion in one embodiment. For example, where the next DBI setting is associated with a non-inversion of a data bus, the next portion of data may not be inverted (e.g., passed through) in step 735 responsive to accessing or detecting the next DBI setting. Thereafter, the next portion of data may be transmitted over the data path in non-inverted form.

As shown in FIG. 7B, step 740 involves transmitting the next DBI setting over the data path. In one embodiment, the next DBI setting may be transmitted in step 740 contemporaneously (e.g., in parallel, as part of the same data packet, etc.) with the next portion of data transmitted in step 735. Alternatively, the next portion of data and the next DBI setting may be transmitted sequentially (e.g., serially) in one embodiment.

Step 745 involves determining whether all the bits of the data path (e.g., associated with output data 425) have been toggled. If it is determined in step 745 that all bits have not been toggled, then process 700 may proceed to step 725 to repeat steps 725 to 740 for the next portion of data (e.g., the portion of data associated with the fourth row of input data 405 of either diagram 500 or diagram 600, the portion of data associated with the fifth row of input data 405 of either diagram 500 or diagram 600, etc.). Alternatively, if it is determined in step 745 that all bits have been toggled, then process 700 may proceed to step 750.

Step 750 involves determining whether all portions of data have been transmitted. If it is determined in step 750 that all portions of data have been transmitted, then process 700 may terminate. Alternatively, if it is determined in step 750 that all portions of data have not been transmitted, then process 700 may proceed to step 755.

As shown in FIG. 7B, step 755 involves determining whether the DBI setting bit has been toggled. If it is determined in step 755 that the DBI setting bit has not been toggled, then the value of the DBI setting that causes the DBI setting bit to be toggled may be selected in step 760 as the next DBI setting. In this case, process 700 may then proceed to step 735.

Alternatively, if it is determined in step 755 that the DBI setting bit has been toggled, then any value of the DBI setting may be selected in step 765 as the next DBI setting. In this case, process 700 may then proceed to step 735.

In one embodiment, process 700 may be performed by a memory controller (e.g., 110) that runs slower than a coupled memory (e.g., 120). For example, the memory (e.g., 120) may run at a frequency (e.g., a clock frequency) that is a multiple (e.g., two, four, another multiple, etc.) of the frequency of the memory controller (e.g., 110). In this case, data (e.g., input data 405) may be buffered (e.g., in groups of 4 words, 8 words, some other quantity of data, etc.) in the memory controller before processing and/or communication over the interface (e.g., 130) and/or data path (e.g., write path 117, read path 127, etc.). As such, one or more steps of process 700 may be performed on or applied to the buffered data.

In one embodiment, one or more steps of process 700 may be performed in a pipelined fashion. And in one embodiment, one or more steps of process 700 may be performed in parallel.

Recovery Reduction

Figure 8:
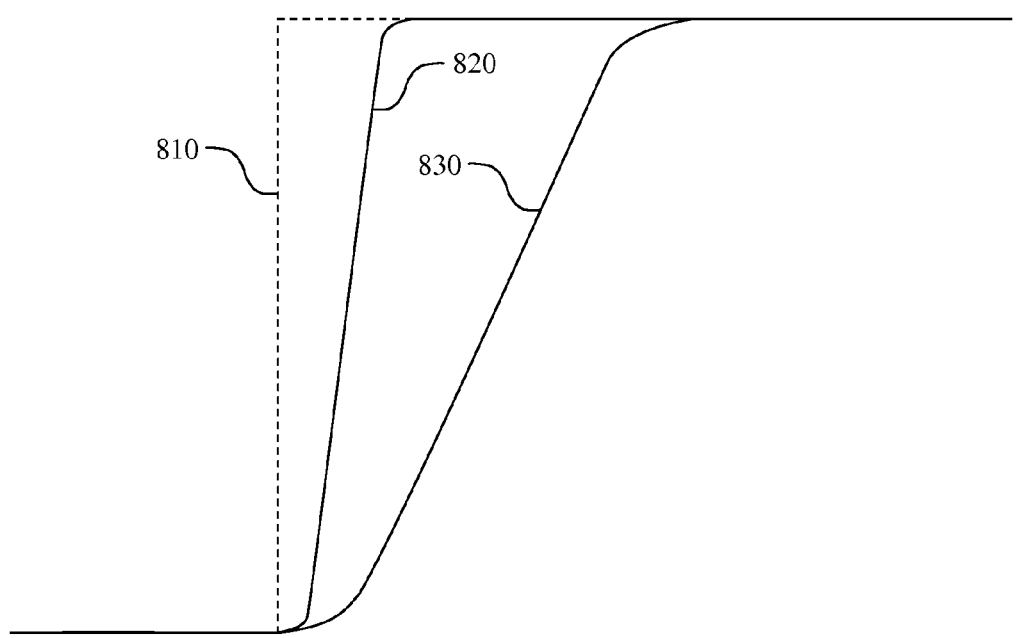
FIG. 8 shows an exemplary diagram depicting signals with different delays caused by different recovery periods in accordance with one embodiment of the present invention.

FIG. 8 shows exemplary diagram 800 depicting signals with different delays caused by different recovery periods in accordance with one embodiment of the present invention. The term "recovery period" as used herein may refer to the amount of time or time period in which at least one transistor of a data path is allowed to remain in an "off" state before transitioning to an "on" state. As shown in FIG. 8, signal 810 may represent a transition from an "off" state to an "on" state with no or very little delay, where the no or very little delay may result from a relatively long or extended recovery period (e.g., allowing the transistor or transistors in the data path to completely recover or almost completely recover from the aged state). Signal 820 may represent a transition from an "off" state to an "on" state with an intermediate amount of delay (e.g., more than signal 810 but less than signal 830), where the delay may result from an intermediate recovery period (e.g., more than the recovery period associated with signal 810 but less than the recovery period associated with signal 830). Signal 830 may represent a transition from an "off" state to an "on" state with a large delay (e.g., more than signal 820), where the delay may result from no recovery period or a very small recovery period (e.g., less than the recovery period associated with signal 820).

In one embodiment, differences in delay between different signals may characterize or cause timing uncertainty. Accordingly, timing uncertainty may be reduced by advantageously reducing the recovery period associated with one or more transistors in a data path, thereby allowing a tighter range on the delay of the data path, and thus greater system margin and/or higher data transmission speeds.

Figure 9:
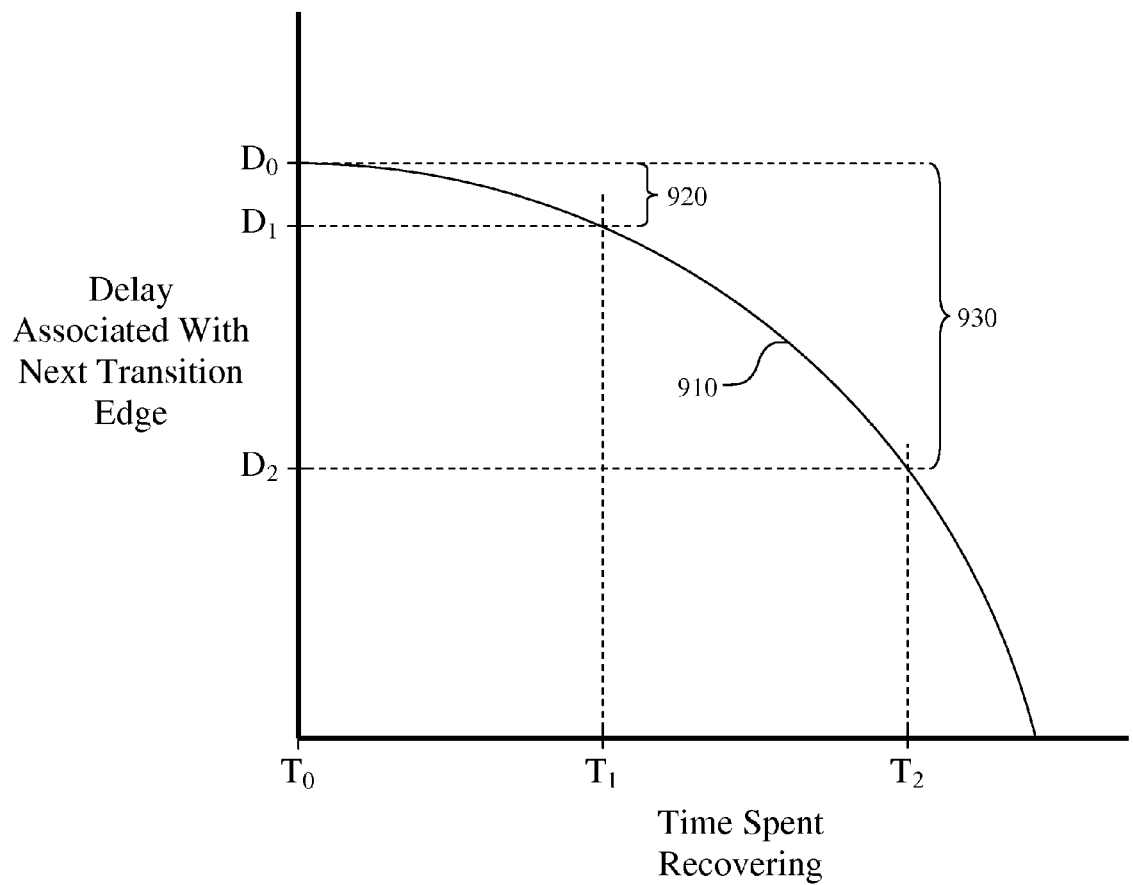
FIG. 9 shows an exemplary graph depicting different delay ranges associated with different recovery periods in accordance with one embodiment of the present invention.

FIG. 9 shows exemplary graph 900 depicting different delay ranges associated with different recovery periods in accordance with one embodiment of the present invention. As shown in FIG. 9, plot 910 may represent a relationship between the time at least one transistor spends recovering (e.g., associated with the "x" axis) and the delay associated with the next transition edge (e.g., associated with the "y" axis). For example, a recovery period associated with $T_1$ (e.g., the difference or the time between $T_1$ and $T_0$) may be associated with delay $D_1$, whereas a recovery period associated with time $T_2$ (e.g., the difference or the time between $T_2$ and $T_0$) may be associated with delay $D_2$.

Accordingly, by limiting the recovery time to $T_1$ for one or more transistors in a data path, the range of possible delays associated with the one or more transistors may be limited to delay range 920 (e.g., between $D_0$ and $D_1$). Similarly, by limiting the recovery time to $T_2$ for one or more transistors in a data path, the range of possible delays associated with the one or more transistors may be limited to delay range 930 (e.g., between $D_0$ and $D_2$). Thus, where a delay range (e.g., 920 or 930) is associated with a timing uncertainty, the timing uncertainty may be reduced by reducing or limiting the recovery period.

In one embodiment, plot 910 may be non-linear (e.g., curved, exponential, etc.). As such, although the recovery period associated with $T_2$ may be twice the recovery period associated with $T_1$ in one embodiment, delay range 930 (e.g., associated with $T_2$) may be over twice the size (e.g., nearly 5 times the size as depicted in FIG. 9) of delay range 920 (e.g., associated with $T_2$). In this manner, embodiments of the present invention may advantageously utilize smaller recovery periods (e.g., less than approximately 3 microseconds, less than approximately 1 microsecond, less than another time period, etc.) to further reduce timing uncertainty.

In accordance with one or more embodiments of the present invention, recovery of one or more transistors of a data path (e.g., write path 117, read path 127, etc.) may be reduced by periodically communicating (e.g., during or as part of refresh intervals of a memory interface) data over a data path which toggles at least one bit of the data path. Toggling of at least one bit may reset the recovery period for at least one transistor in the data path associated with the at least one bit, and therefore, periodic toggling of the at least one bit may be used to limit the recovery period of the at least one transistor (e.g., to no greater than the period of the periodic data communication). Accordingly, recovery of transistors in a data path may be limited to predetermined amount by toggling bits of the data path at a predetermined frequency (e.g., associated with the frequency of the data communication over the data path), thereby reducing timing uncertainty and allowing a smaller system margin and/or higher data transmission speeds.

Although FIG. 8 shows signals with specific shapes and sizes, it should be appreciated that the signals (e.g., 810, 820, 830, etc.) depicted in diagram 800 are exemplary and may have different shapes and/or sizes in other embodiments.

Although FIG. 9 shows plot 910 with a specific shape and size, it should be appreciated that plot 910 is exemplary and may have a different shape and/or size in other embodiments. For example, plot 910 may be linear in one embodiment. As another example, plot 910 may have a slight slope (e.g., a small decrease in delay as time increases) at smaller times (e.g., from $T_0$ to $T_1$), whereas plot 910 may have a much steeper slope (e.g., a larger decrease in delay as time increases) at larger times (e.g., around $T_2$ and beyond).

Figure 10A:
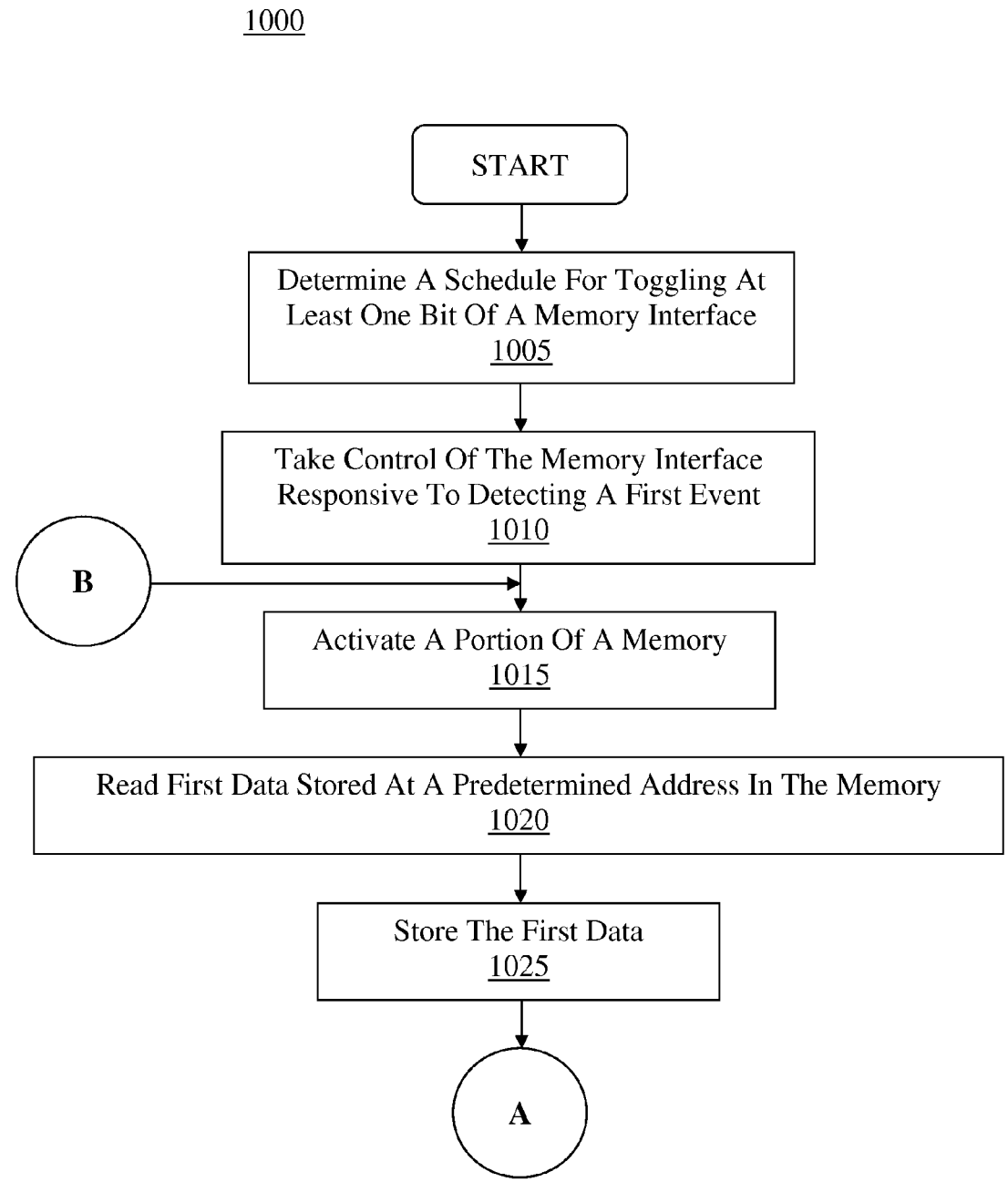
FIG. 10A shows a first portion of a flowchart of an exemplary process for reducing transistor recovery in accordance with one embodiment of the present invention.
Figure 10B:
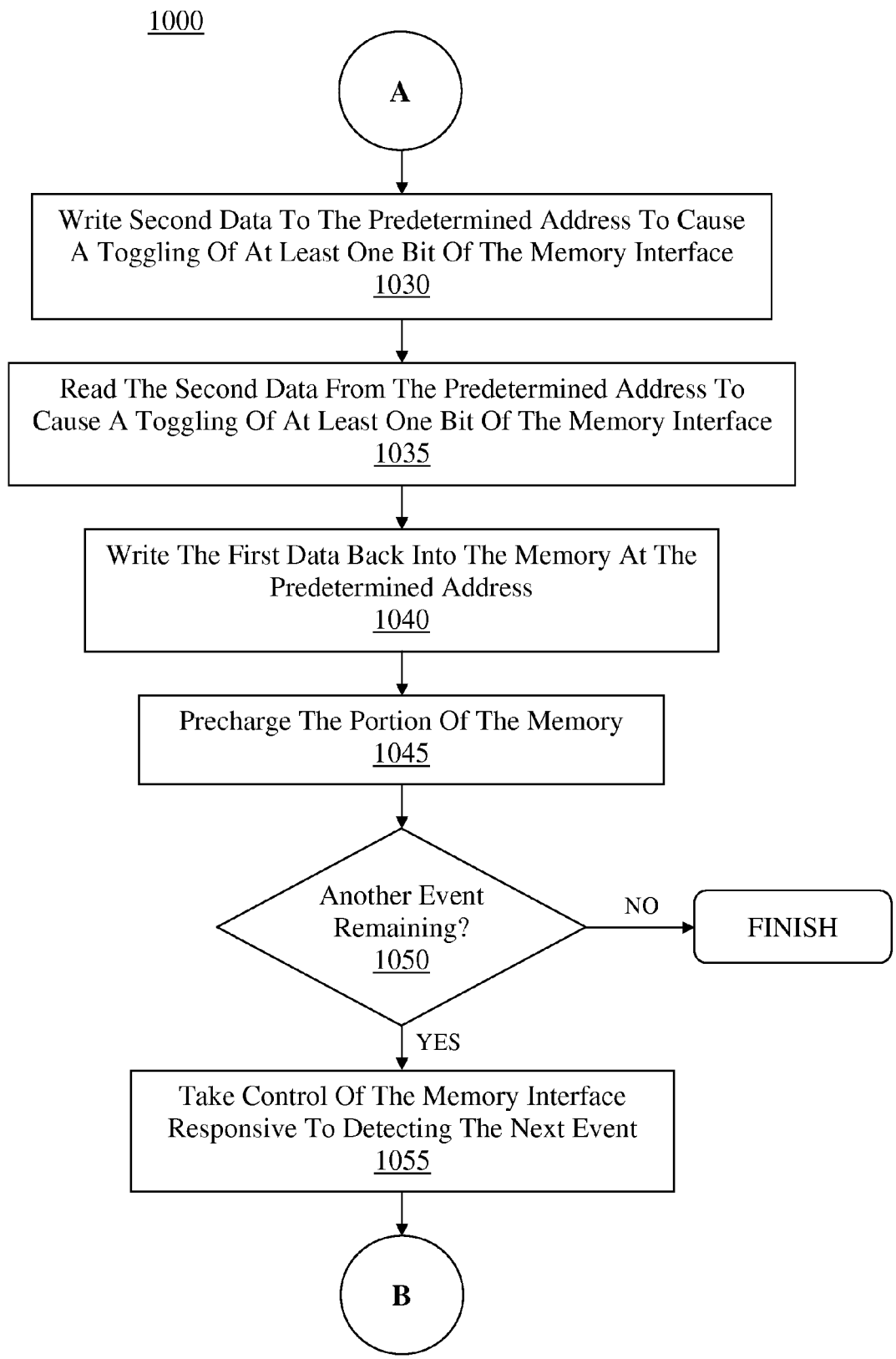
FIG. 10B shows a second portion of a flowchart of an exemplary process for reducing transistor recovery in accordance with one embodiment of the present invention.

FIGS. 10A and 10B show a flowchart of exemplary process 1000 for reducing transistor recovery in accordance with one embodiment of the present invention. In one embodiment, one or more steps of process 1000 may be performed by a memory controller (e.g., 110) or at least one component thereof.

As shown in FIG. 10A, step 1005 involves determining a schedule for toggling at least one bit of a memory interface (e.g., 130). The schedule may include at least one event for toggling the at least one bit. Each event may correspond to a respective refresh interval or period of the memory interface in one embodiment.

Step 1010 involves taking control of the memory interface (e.g., 130) responsive to detecting a first event (e.g., based on the schedule). The first event may be associated with a first refresh interval of the memory interface in one embodiment.

As shown in FIG. 10A, step 1015 involves activating a portion of a memory. The portion of memory activated in step 1015 may be a bank of a memory (e.g., 120) in one embodiment. And in one embodiment, the portion of memory may be activated in step 1015 using an "activate" command.

Step 1020 involves reading first data stored at a predetermined address in the memory. Step 1025 involves storing the first data. In one embodiment, the first data may be stored in a memory (e.g., at least one buffer, at least one register, etc.) of a memory controller (e.g., 110).

As shown in FIG. 10B, step 1030 involves writing second data to the predetermined address in the memory to cause a toggling of at least one bit of the memory interface (e.g., write path 117). In one embodiment, the second data written in step 1030 may be an inverse of the first data written in step 1040 (e.g., causing a toggling of the at least one bit responsive to writing the first data back into the memory in step 1040). In one embodiment, the second data may be written or communicated as a burst.

Step 1035 involves reading the second data from the predetermined address in the memory to cause a toggling of at least one bit of the memory interface (e.g., read path 127). In one embodiment, the second data read in step 1035 may be an inverse of the first data read in step 1020 (e.g., causing a toggling of the at least one bit responsive to reading the second data in step 1035). In one embodiment, the second data may be read or communicated as a burst.

As shown in FIG. 10B, step 1040 involves writing the first data back into the memory at the predetermined address. As such, the data in the memory may be restored (e.g., to the state before the reading of the first data in step 1020). Additionally, where the first data is an inverse of the second data and where the second data is written in step 1030, the at least one bit may be toggled in step 1040 responsive to writing the first data back into the memory.

Step 1045 involves precharging the portion of the memory (e.g., 120). In one embodiment, the portion of memory may be precharged in step 1045 using a "precharge" command. In some embodiments of the present invention, the steps of activating and precharging may be omitted if the state of the bank is known to be open or closed. In the current embodiment, it is assumed that the banks start closed.

As shown in FIG. 10B, step 1050 involves determining whether another event remains (e.g., based on the schedule). The next event may be associated with a subsequent refresh interval of the memory interface in one embodiment. In one embodiment, initiation of the next event (e.g., associated with a consecutive refresh interval) may occur within 5 microseconds of the initiation of the first event.

If it is determined in step 1050 that another event does not remain, then process 1000 may conclude. Alternatively, if it is determined in step 1050 that at least one other event remains, then process 1000 may proceed to step 1055.

Step 1055 involves taking control of the memory interface responsive to detecting the next event. Process 1000 may then proceed to step 1015 to repeat steps 1015 through 1050 with respect to the next event.

Accordingly, data may be periodically communicated (e.g., during or as part of refresh intervals) over an interface (e.g., including at least one data path such as write path 117, read path 127, etc.) to toggle at least one bit of the interface and reduce or limit recovery of one or more transistors of the interface. The recovery of the one or more transistors may be reduced or limited to a predetermined amount (e.g., based on the frequency of data communication and/or the events associated with the data communication), thereby reducing timing uncertainty and allowing a smaller system margin and/or higher data transmission speeds over the interface.

Combination of Processes to Further Reduce EOL Effects

Although techniques or processes for reducing aging and recovery are discussed separately herein, it should be appreciated that any combination of the techniques or processes may be used to further reduce EOL effects. For example, process 300 may be used in combination with process 700 and/or process 1000 to further reduce EOL effects. As another example, process 700 may be used in combination with process 300 and/or process 1000 to further reduce EOL effects. And as yet another example, process 1000 may be used in combination with process 300 and/or process 700 to further reduce EOL effects.

Programmable Logic Device

FIG. 11 shows exemplary programmable logic device (PLD) 1100 that can be used to implement one or more components of one or more embodiments of the present invention. For instance, PLD 1100 may be used to implement a system (e.g., 100) or at least one component thereof, a circuit (e.g., 200, 400, etc.) or at least one component thereof, some combination thereof, etc. In one embodiment, PLD 1100 of FIG. 11 may be used to implement a field programmable gate array (FPGA), a complex programmable logic device (CPLD), a programmable logic arrays (PLA), or some other type of programmable logic device.

As shown in FIG. 11, PLD 1100 may include a plurality of programmable logic array blocks (LABs). The LABs of PLD 1100 may be arranged in rows and/or columns (e.g., as two-dimensional arrays) in one embodiment. For example, columns 1111, 1112, 1113, 1114, 1115 and 1116 may include one or more LABs. In one embodiment, the LABs may be interconnected by a network of column interconnect conductors and/or row interconnect conductors.

Each LAB may include logic that can be configured to implement one or more user-defined logic functions. For example, the interconnect structure of a LAB may be programmed to interconnect the components of the LAB in one or more desired configurations. A LAB may include at least one look-up table (LUT), at least one register, at least one multiplexer, some combination thereof, etc. In one embodiment, the logic may be organized into a plurality of logic elements (LEs), where the interconnection of the LEs can be programmed to vary the functionality of the LAB. And in one embodiment, each LAB may implement or form at least one logic element cluster, where each logic element cluster includes one or more respective LEs.

As shown in FIG. 11, PLD 1100 may include a plurality of memory blocks (e.g., memory block 1130, memory blocks in columns 1121, 1122, 1123, 1124, etc.). In one embodiment, a memory block may include random access memory (RAM), where the RAM may be used to provide multi-port memory, dedicated true dual-port memory, simple dual-port memory, single-port memory, or some combination thereof. And in one embodiment, a memory block may include at least one shift register, at least one first-in-first-out (FIFO) buffer, at least one flip-flop, some combination thereof, etc.

The memory blocks of PLD 1100 may be arranged in rows and/or columns (e.g., as two-dimensional arrays) in one embodiment. For example, columns 1121, 1122, 1123 and 1124 may include one or more memory blocks. Alternatively, one or more memory blocks (e.g., 1130) may be located individually or in small groups (e.g., of two memory blocks, three memory blocks, etc.) in the PLD.

As shown in FIG. 11, PLD 1100 may include a plurality of digital signal processing (DSP) blocks. The DSP blocks may provide digital signal processing functions such as FIR filtering, infinite impulse response (IIR) filtering, image processing, modulation (e.g., equalization, etc.), encryption, error correction, etc. The DSP blocks may offer other functionality such as accumulation, addition/subtraction, summation, etc.

PLD 1100 may include a plurality of input/output elements (IOEs). Each IOE may include at least one input buffer and/or at least one output buffer coupled to one or more pins of the PLD, where the pins may be external terminals separate from the die of the PLD. In one embodiment, an IOE may be used to communicate input signals, output signals, supply voltages, etc. between other components of the PLD and one or more external devices (e.g., separate from the PLD). In one embodiment, the IOEs may be located at end of the rows and columns of the LABs around the periphery of PLD 1100 (e.g., in column 1151, in row 1152, etc.).

In one embodiment, PLD 1100 may include routing resources. For example, PLD 1100 may include LAB local interconnect lines, row interconnect lines (e.g., "H-type wires"), column interconnect lines (e.g., "V-type wires"), etc. that may be used to route signals between components of PLD 1100. The routing resources may be configurable or programmable (e.g., by a user, based on a user design or function, etc.) in one embodiment.

And in one embodiment, PLD 1100 may include or otherwise implement at least one processor and at least one memory. The at least one memory may be a computer-readable medium or computer-usable medium in one embodiment, where the at least one memory may include instructions that when executed by the at least one processor may implement a method of reducing aging of at least one component of a data path (e.g., in accordance with process 300 of FIG. 3), a method of reducing aging of at least one component of a data path (e.g., in accordance with process 700 of FIGS. 7A and 7B), a method of reducing transistor recovery (e.g., in accordance with process 1000 of FIGS. 10A and 10B), some combination thereof, etc.

Although one or more embodiments of the present invention may be implemented using a PLD (e.g., 1100 of FIG. 11), it should be appreciated that one or more other embodiments of the present invention may be implemented using other systems, components, circuitry, etc. For example, one or more embodiments of the present invention may be implemented using an application specific integrated circuit (ASIC), a memory integrated circuit, a central processing unit, a microprocessor, an analog integrated circuit, another type of integrated circuit, other circuitry, some combination thereof, etc.

Computer System Platform

Figure 12:
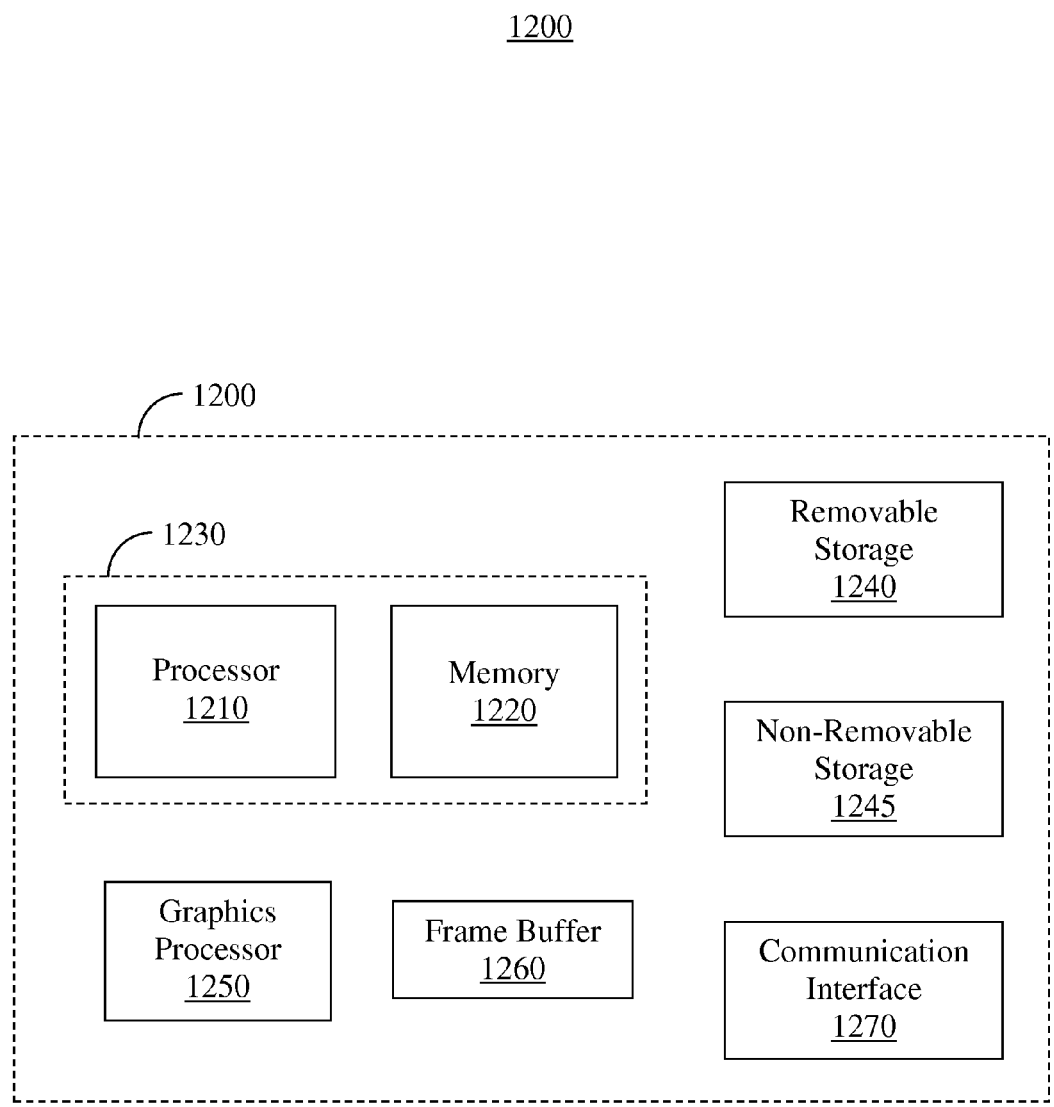
FIG. 12 shows an exemplary computer system platform upon which embodiments of the present invention may be implemented.

FIG. 12 shows exemplary computer system platform 1200 upon which embodiments of the present invention may be implemented. As shown in FIG. 12, portions of the present invention may be implemented by execution of computer-readable instructions or computer-executable instructions that may reside in components of computer system platform 1200 and which may be used as a part of a general purpose computer network. It is appreciated that computer system platform 1200 of FIG. 12 is merely exemplary. As such, the present invention can operate within a number of different systems including, but not limited to, general-purpose computer systems, embedded computer systems, laptop computer systems, hand-held computer systems, portable computer systems, or stand-alone computer systems.

In one embodiment, computer system platform 1200 may be used to implement a system (e.g., 100) or at least one component thereof, a circuit (e.g., 200, 400, etc.) or at least one component thereof, some combination thereof, etc. Computer system platform 1200 may include at least one PLD (e.g., 1100 of FIG. 11) in one embodiment. In one embodiment, at least a portion of computer system platform 1200 may be implemented using at least one PLD (e.g., 1100 of FIG. 11). And in one embodiment, one or more components of computer system platform 1200 may be disposed in and/or coupled with a housing or enclosure.

In one embodiment, depicted by dashed lines 1230, computer system platform 1200 may include at least one processor 1210 and at least one memory 1220. Processor 1210 may include a central processing unit (CPU) or other type of processor. Depending on the configuration and/or type of computer system environment, memory 1220 may include volatile memory (e.g., RAM), non-volatile memory (e.g., ROM, flash memory, etc.), or some combination of the two. Additionally, memory 1220 may be removable, non-removable, etc.

In other embodiments, computer system platform 1200 may include additional storage (e.g., removable storage 1240, non-removable storage 1245, etc.). Removable storage 1240 and/or non-removable storage 1245 may include volatile memory, non-volatile memory, or any combination thereof. Additionally, removable storage 1240 and/or non-removable storage 1245 may include CD-ROM, digital versatile disks (DVD) or other optical storage, magnetic cassettes, magnetic tape, magnetic disk storage or other magnetic storage devices, or any other medium which can be used to store information for access by computer system platform 1200.

As shown in FIG. 12, computer system platform 1200 may communicate with other systems, components, or devices via communication interface 1270. Communication interface 1270 may embody computer-readable instructions, data structures, program modules or other data in a modulated data signal (e.g., a carrier wave) or other transport mechanism. By way of example, and not limitation, communication interface 1270 may couple to wired media (e.g., a wired network, direct-wired connection, etc.) and/or wireless media (e.g., a wireless network, a wireless connection utilizing acoustic, radio frequency (RF), infrared, or other wireless signaling, etc.).

Communication interface 1270 may also couple computer system platform 1200 to one or more input devices (e.g., a keyboard, mouse, pen, voice input device, touch input device or touch screen, etc.). In one embodiment, communication interface 1270 may couple computer system platform 1200 to one or more output devices (e.g., a display, speaker, printer, etc.).

As shown in FIG. 12, graphics processor 1250 may perform graphics processing operations on graphical data stored in frame buffer 1260 or another memory (e.g., 1220, 1240, 1245, etc.) of computer system platform 1200. Graphical data stored in frame buffer 1260 may be accessed, processed, and/or modified by components (e.g., graphics processor 1250, processor 1210, etc.) of computer system platform 1200 and/or components of other systems or devices. Additionally, the graphical data may be accessed (e.g., by graphics processor 1250) and displayed on an output device coupled to computer system platform 1200. Accordingly, memory 1220, removable storage 1240, non-removable storage 1245, frame buffer 1260, or a combination thereof, may be a computer-readable medium (e.g., a computer-readable storage medium) or computer-usable medium and may include instructions that when executed by a processor (e.g., 1210, 1250, etc.) implement a method of reducing aging of at least one component of a data path (e.g., in accordance with process 300 of FIG. 3), a method of reducing aging of at least one component of a data path (e.g., in accordance with process 700 of FIGS. 7A and 7B), a method of reducing transistor recovery (e.g., in accordance with process 1000 of FIGS. 10A and 10B), some combination thereof, etc.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of reducing aging of at least one component of a data path, said method comprising:
   monitoring a first data signal to determine a quantity associated with a relative number of instances of a first logical state and a second logical state, wherein said first data signal is communicated to a device over said data path, and wherein said first data signal represents a greater number of instances of said first logical state than said second logical state;
   determining that said data path is inactive; and
   while said data path is inactive, communicating a second data signal over said data path to reduce aging of at least one component of said data path, wherein said second data signal represents a number of instances of said second logical state that exceeds a number of instances of said first logical state by said quantity.

2. The method of claim 1, wherein said monitoring further comprises determining said quantity using a counter.

3. The method of claim 1 further comprising:
   determining that said data path is active, and
   wherein said monitoring further comprises monitoring said first data signal responsive to said determining that said data path is active.

4. The method of claim 1, wherein said monitoring is performed using a circuit of a memory controller, wherein said device comprises a memory coupled to said memory controller, and wherein further said data path is a write data path.

5. The method of claim 4, wherein said memory controller is implemented using a programmable logic device.

6. The method of claim 1, wherein said monitoring is performed using a circuit of a memory, wherein said device comprises a memory controller coupled to said memory, and wherein further said data path is a read data path.

7. A circuit comprising:
a first component comprising a first input and a second input, wherein said first component further comprises an output coupled to a data path, wherein said first component is operable to communicate a first data signal from said first input to said output in a first state, and wherein said first data signal includes a greater number of instances of a first logical state than a second logical state;
a counter; and
at least one other component operable to monitor said first data signal and control said counter to store a quantity associated with a relative number of instances of said first logical state and said second logical state, and wherein said at least one other component is further operable to generate a second data signal indicative of a number of instances of said second logical state that exceeds a number of instances of said first logical state by said quantity, and
wherein said first component is further operable, in said second state, to communicate said second data signal from said second input to said output to reduce aging of at least one component of said data path, wherein said first state is associated with said data path being active, and wherein said second state is associated with said data path being inactive.

8. The circuit of claim 7, wherein said first component comprises a multiplexer.

9. The circuit of claim 7, wherein said at least one other component comprises a plurality of multiplexers.

10. The circuit of claim 7, wherein said circuit is implemented in a memory controller, wherein said memory controller is coupled to a memory by said data path, and wherein said data path is a write data path.

11. The circuit of claim 10, wherein said memory controller is implemented using a programmable logic device.

12. The circuit of claim 7, wherein said circuit is implemented in a memory, wherein said memory is coupled to a memory controller by said data path, and wherein said data path is a read data path.

13. A method of reducing aging of at least one component of a data path, said method comprising:
accessing a first portion of data to be transmitted over said data path;
performing a comparison of said first portion of data and a second portion of data, wherein said second portion of data is transmitted over said data path before said first portion of data;
determining, based on said comparison, a first data bus inversion setting associated with transmission of said first portion of data over said data path, and determining that said first data bus inversion setting causes a larger number of bits to toggle than a second data bus inversion setting associated with said transmission of said first portion of data; and
transmitting said first portion of data over said data path using said first data bus inversion setting to reduce aging of said at least one component of said data path.

14. The method of claim 13 further comprising:
transmitting said data bus inversion setting over said data path.

15. The method of claim 13, wherein said data path is selected from a group consisting of a write data path and a read data path.

16. The method of claim 13 further comprising:
accessing a third portion of data to be transmitted over said data path;
performing a comparison of said third portion of data and said first portion of data, wherein said first portion of data is transmitted over said data path before said third portion of data; and
determining, based on said comparison, a third data bus inversion setting associated with transmission of said third portion of data over said data path.

17. The method of claim 16 further comprising:
performing a comparison of said data bus inversion setting and said third data bus inversion setting, and
wherein said determining said third data bus inversion setting further comprises determining that said third data bus inversion setting is different from said data bus inversion setting.

18. The method of claim 13, wherein said determining further comprises:
determining that said data bus inversion setting causes a same number of bits to toggle as a second data bus inversion setting; and
determining that said data bus inversion setting is different from a second data bus inversion setting associated with transmission of said second portion of data over said data path.

19. The method of claim 18 further comprising:
accessing a third portion of data to be transmitted over said data path;
performing a comparison of said third portion of data and said first portion of data, wherein said first portion of data is transmitted over said data path before said third portion of data; and
determining, based on said comparison, a third data bus inversion setting associated with transmission of said third portion of data over said data path.

* * * * *